(12) United States Patent
Mallya Kasaragod

(10) Patent No.: US 11,574,243 B1
(45) Date of Patent: Feb. 7, 2023

(54) HETEROGENEOUS COMPUTE INSTANCE AUTO-SCALING WITH REINFORCEMENT LEARNING

(71) Applicant: Amazon Technologies, Inc., Seattle, WA (US)

(72) Inventor: Sunil Mallya Kasaragod, San Francisco, CA (US)

(73) Assignee: Amazon Technologies, Inc., Seattle, WA (US)

( * ) Notice: Subject to any disclaimer, the term of this patent is extended or adjusted under 35 U.S.C. 154(b) by 814 days.

(21) Appl. No.: 16/451,878

(22) Filed: Jun. 25, 2019

(51) Int. Cl.
*G06N 20/00* (2019.01)
*G06F 9/50* (2006.01)
*G06F 30/20* (2020.01)

(52) U.S. Cl.
CPC ............ *G06N 20/00* (2019.01); *G06F 9/505* (2013.01); *G06F 9/5055* (2013.01); *G06F 30/20* (2020.01)

(58) Field of Classification Search
CPC .. G06N 20/00; G06N 3/02; G06F 9/45; G06F 9/50; G06F 9/505; G06F 9/5055; G06F 30/20; G06F 30/30; G06F 17/5009; G06K 9/6267
USPC ........................................................ 709/226
See application file for complete search history.

(56) References Cited

U.S. PATENT DOCUMENTS

| | | | | |
|---|---|---|---|---|
| 2008/0262824 A1* | 10/2008 | Oslake | ...................... | G06F 8/20 703/22 |
| 2013/0100849 A1* | 4/2013 | Szabo | .................. | G06K 9/6267 370/253 |
| 2015/0058265 A1* | 2/2015 | Padala | .................... | G06N 20/00 706/12 |
| 2018/0067778 A1* | 3/2018 | Hawilo | ................. | G06F 9/5033 |
| 2018/0287856 A1* | 10/2018 | Whitner | .............. | H04L 41/0613 |
| 2020/0065704 A1* | 2/2020 | Nag | ......................... | G06F 30/27 |
| 2020/0293828 A1* | 9/2020 | Wang | ..................... | G06V 10/95 |

FOREIGN PATENT DOCUMENTS

| WO | WO-2019215269 A1 * | 11/2019 | ............. G01C 21/20 |
|---|---|---|---|
| WO | WO-2019219965 A1 * | 11/2019 | ............. G06N 3/006 |

OTHER PUBLICATIONS

Lorido-Botran, T., Miguel-Alonso, J. & Lozano, J.A. A Review of Auto-scaling Techniques for Elastic Applications in Cloud Environments. J Grid Computing 12, 559-592 (2014). https://doi.org/10.1007/s10723-014-9314-7 (Year: 2014).*

Qu C, Calheiros RN, Buyya R. Auto-scaling web applications in clouds: A taxonomy and survey. ACM Computing Surveys (CSUR). Jul. 13, 2018;51(4):1-33. (Year: 2018).*

(Continued)

*Primary Examiner* — James N Fiorillo
(74) *Attorney, Agent, or Firm* — Nicholson De Vos Webster & Elliott LLP

(57) ABSTRACT

Techniques for heterogeneous compute instance auto-scaling with reinforcement learning (RL) are described. A user specifies a reward function that generates rewards for use with an application simulation for determining what different instance types should be added to or removed from the application as part of training a RL model. The RL model can be automatically deployed and used to monitor an application to automatically scale the application fleet using heterogenous compute instances.

20 Claims, 10 Drawing Sheets

(56) References Cited

OTHER PUBLICATIONS

Lorido-Botran, T., Miguel-Alonso, J. & Lozano, J.A. A Review of Auto-scaling Techniques for Elastic Applications in Cloud Environments. J Grid Computing 12, 559-592 (2014). https://doi.org/10.1007/s10723-014-9314-7 (Year: 2014) (Year: 2014).*

Cheng YL, Lin CC, Liu P, Wu JJ. High resource utilization auto-scaling algorithms for heterogeneous container configurations. In2017 IEEE 23rd International Conference on Parallel and Distributed Systems (ICPADS) Dec. 15, 2017 (pp. 143-150). IEEE (Year: 2017).*

Russo GR, Cardellini V, Presti FL. Reinforcement learning based policies for elastic stream processing on heterogeneous resources. InProceedings of the 13th ACM International Conference on Distributed and Event-based Systems Jun. 24, 2019 (pp. 31-42). (Year: 2019).*

Murdoch WJ, Singh C, Kumbier K, Abbasi-Asi R, Yu B. Definitions, methods, and applications in interpretable machine learning. Proceedings of the National Academy of Sciences. Oct. 29, 2019;116(44):22071-80. (Year: 2019).*

\* cited by examiner

```
DEF _GENERATE_REWARD(STATE):
    """RETURNS REWARD.
    """
    LOAD_THRESHOLD = 80
    COST_THRESHOLD = 200

IF (STATE.ACTION == REMOVE_CAPACITY)
        IF STATE.CURRENT_LOAD >= LOAD_THRESHOLD
            RETURN -10
        ELSE IF (LOAD_THRESHOLD - STATE.CURRENT_LOAD < 10)
            RETURN -3
        ELSE IF (LOAD_THRESHOLD - STATE.CURRENT_LOAD < 30)
            RETURN +3
        ELSE
            RETURN +10

IF (STATE.ACTION == NONE)
        IF STATE.CURRENT_LOAD >= LOAD_THRESHOLD
            RETURN -10
        ELSE IF (LOAD_THRESHOLD - STATE.CURRENT_LOAD < 10)
            RETURN -5
        IF (STATE.COST > COST_THRESHOLD) AND (LOAD_THRESHOLD - STATE.CURRENT_LOAD > 5)
            RETURN -10
        ...

IF (STATE.ACTION == ADD_CAPACITY)
        ...
        IF (STATE.ADDED_INSTANCE_TYPE == TYPE2)
```

THRESHOLD DEFINITIONS 505

"REMOVAL" ACTION REWARD LOGIC 510

PARTIAL INSTANCE-TYPE SPECIFIC LOGIC 515

HETEROGENEOUS COMPUTE INSTANCE AUTO-SCALING WITH REINFORCEMENT LEARNING

BACKGROUND

Multi-tenant provider networks are implemented using physical computing devices that are connected to each other via one or more networks. Typically, provider networks execute compute instances such as virtual machines to execute applications. The performance of these applications thus depends on a variety of factors, including the workload being placed on the applications and the number and type of compute instances implementing the applications. Moreover, as the workloads of many applications can significantly change over time, provider networks must be able to adapt to be able to handle these changing workloads.

Thus, elasticity is an important feature of provider networks. Elasticity generally refers to the ability to scale up or down the infrastructure—such as compute instances or other resources—to handle changing workload conditions. Often, provider networks provide scaling based on resource usage thresholds set by its users, which may be static values or formulaic. For example, the thresholds may be based on specific resource usage conditions associated with the compute instances run by the user, such as an average processor utilization or memory utilization. However, scaling based on these types of thresholds is not sufficient to scale complex applications such as multi-tier applications that often have complicated dependencies, further complicating a determination of which tier of the application, and what particular resource or resources (processing, memory, storage, networking, etc.) to scale.

BRIEF DESCRIPTION OF DRAWINGS

Various embodiments in accordance with the present disclosure will be described with reference to the drawings, in which:

FIG. 5 is a diagram illustrating an exemplary user-specified reward function according to some embodiments.

DETAILED DESCRIPTION

Figure 1:
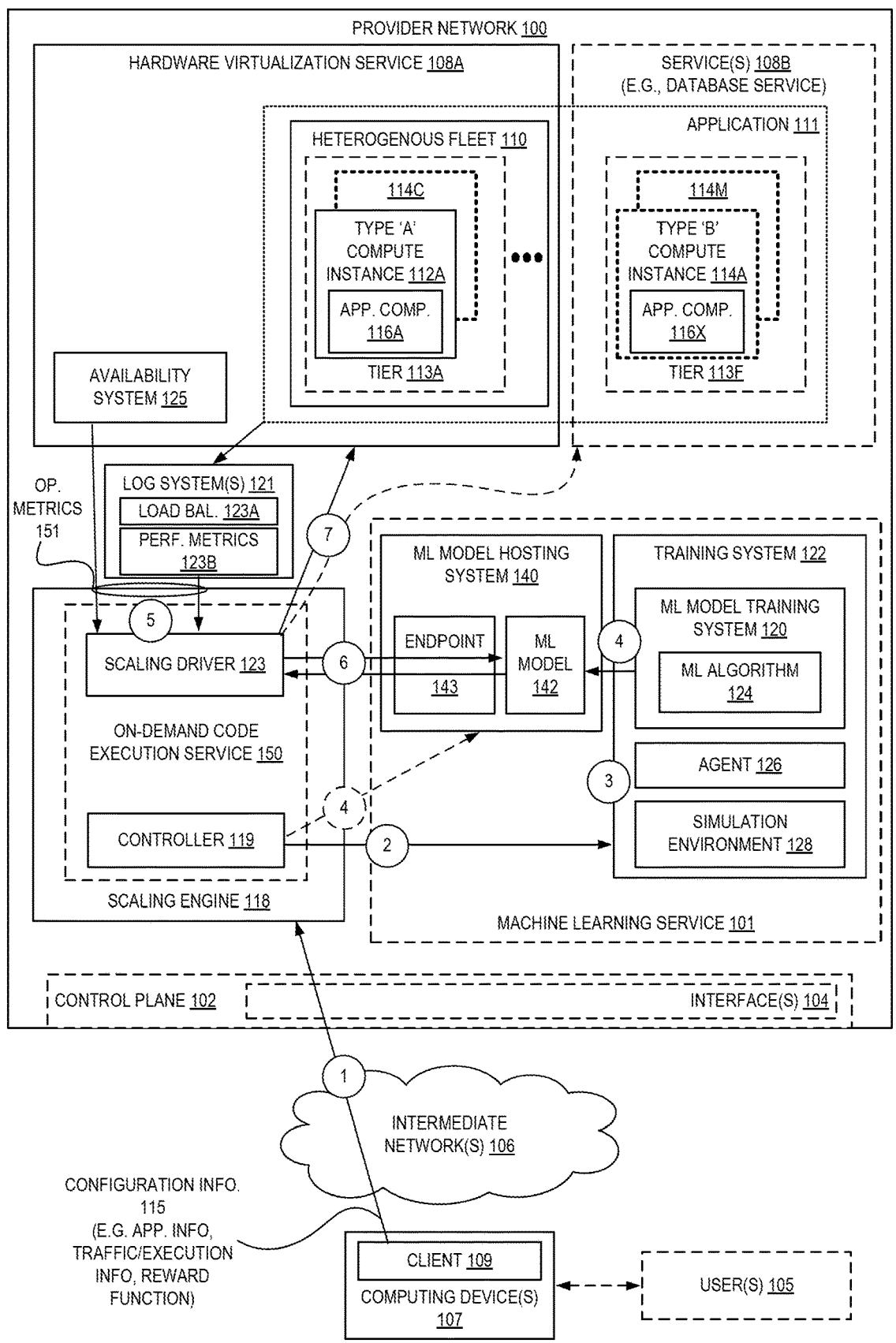
FIG. 1 is a diagram illustrating an environment for heterogeneous compute instance auto-scaling with reinforcement learning according to some embodiments.

The present disclosure relates to methods, apparatus, systems, and non-transitory computer-readable storage media for heterogeneous compute instance auto-scaling with reinforcement learning. According to some embodiments, a reinforcement learning-based approach is utilized by a scaling engine to provide simple, efficient scaling of application fleets via the potential use of heterogeneous compute instances within the fleet.

Many types of modern applications involve online workloads. For example, running a website or providing a webservice involve having user-issued calls coming into the system. One important problem with such types of online workloads is that the demand is not known or easily predictable ahead of time. Thus, it is crucial to be "elastic" to the demand to accommodate traffic changes over time.

In many cases, the infrastructure of an application is composed of multiple services, each using its own type of compute instances—e.g., a first type of compute instance for a front-end web server fleet, a second type for a backend database fleet, and so on. Generally, a compute instance such as a virtual machine has an associated amount of one or more types of computing resources—e.g., a number of processors or processing cores available to the compute instance, an amount of volatile memory (e.g., Random Access Memory (RAM)) available to the compute instance, an amount of non-volatile memory (e.g., storage such as a magnetic disk, solid state drive (SSD), tape, etc.) available to the compute instance, an amount of network bandwidth available to the compute instance, an amount of special-purpose processors or devices available to the compute instance (e.g., an amount of graphical processing units (GPUs) or accelerators), and so on. Thus, different types of compute instances may have differing amounts of one or more or all of these computing resource dimensions, and different ones of these compute instances may thus be more optimized for particular workloads.

Typically, for each type of functionality in an application (e.g., a tier of an application), a developer will use a same type of compute instance. For example, a web server tier may be implemented using one or multiple compute instances of a same type behind a load balancer. In such configurations, it is possible to scale these homogeneous fleets based on demand using relatively straightforward mathematical techniques—e.g., a doubling of traffic potentially could be accommodated by a doubling of the number of compute instances, as one example.

However, as each workload has different characteristics, as the traffic doubles ones or all of the computing resource usages may grow differently—e.g., in a linear or non-linear fashion (such as quadratic growth). Thus, it may be the case that a doubling of demand may result in a doubling of need for one computing resource such as memory, but a quadrupling increase for another computing resource such as processing capability. Further, this problem is magnified as most developers are unsure about how these utilizations change under different workloads, especially as these needs may change based on the timing or type of demand (which may affect how work is performed), the state of the application over time (e.g., due to feature additions, code refactoring, etc.), and so on. As a result, most developers use compute instances of a same type in a fleet and implement general high-level rules for scaling the infrastructure. Thus, a developer may implement scaling rules to expand or contract their clusters of compute instances based on metrics from a most "needy" compute resource that requires more resources at a fastest rate due to increased system load. Continuing the example of memory increasing at a linear rate but compute (e.g., virtual central processing units (vCPUs)) increasing at a quadratic rate, scaling rules may be set up based on compute metrics—possibly without regard to other resources such as memory—to ensure that all compute resource needs are met.

However, these rules often result in the over-provisioning of resources as some of the "less needy" compute resources of the instances may go unused. For example, by doubling the size of a cluster of compute instances to ensure availability of a first computing resource type (e.g., compute), other resources may be added in amounts that are not needed (e.g., RAM might be doubled but the increase of load may be less than double or not change) and thus this capacity is wasted. Further, as different traffic patterns are observed and/or the profile of the application changes, the oncesimple set of rules configured to control the scaling of the system are typically extended into multiple complex rules sets, which is extremely difficult to maintain over time. Moreover, it is difficult for humans to intuitively grasp the concept of non-linear changes in demand and craft rules accordingly.

Thus, the concept of using heterogenous types of compute instances to implement some (e.g., a tier, a cluster) or all of an application has been desired to be able to more appropriately scale the application's architecture in more precise ways to avoid overprovisioning and resultant compute resource waste. Moreover, it is possible to improve the performance of an application by using different sized compute instances, e.g., when using a compute instance with additional amounts of computing resources may allow for improved execution, such as via having additional memory available that may eliminate the need to perform memory swaps.

Additionally, in some provider networks, it may be the case that a particular first type of compute instance having twice the computing resources than a second type might be less than twice as expensive—or even less expensive than the second type in some cases—and thus there may be a motivation to use "larger" compute instances due to the decrease cost-per-unit of computing resources. As one example, some provider network may provide access to "excess" compute instance capacity in a non-guaranteed, as-available manner at significantly reduced expense, although sometimes without availability guarantees or continued-use guarantees. In such cases, it may be beneficial to rely on different compute instance sizes, e.g., for scaling purposes, when economic factors make it extremely beneficial to do so. However, with the typical use of performance profiles based on the use of a single compute instance and scaling rules derived therefrom, it becomes extremely difficult—if not impossible—to utilize different compute instance types, especially those that may be periodically offered at different times with different economic incentives.

Embodiments disclosed herein provide a reinforcement-learning based approach that enables simple, efficient scaling of application fleets that may utilize heterogeneous compute instances. FIG. 1 is a diagram illustrating an environment for heterogeneous compute instance auto-scaling with reinforcement learning according to some embodiments. FIG. 1 includes a scaling engine 118 that may train and/or utilize reinforcement learning based ML models that can utilize different types of compute instances to scale an application up or down based on any of a variety of possible factors. The scaling engine 118 in some embodiments is implemented as software executed by one or multiple computing devices (e.g., within a provider network 100), though in other embodiments some or all of the scaling engine 118 is implemented using computing hardware.

A provider network 100 provides users with the ability to utilize one or more of a variety of types of computing-related resources such as compute resources (e.g., executing virtual machine (VM) instances and/or containers, executing batch jobs, executing code without provisioning servers), data/storage resources (e.g., object storage, block-level storage, data archival storage, databases and database tables, etc.), network-related resources (e.g., configuring virtual networks including groups of compute resources, content delivery networks (CDNs), Domain Name Service (DNS)), application resources (e.g., databases, application build/deployment services), access policies or roles, identity policies or roles, machine images, routers and other data processing resources, etc. These and other computing resources may be provided as services, such as a hardware virtualization service that can execute compute instances, a storage service that can store data objects, etc. The users (or "customers") of provider networks 100 may utilize one or more user accounts that are associated with a customer account, though these terms may be used somewhat interchangeably depending upon the context of use. Users may interact with a provider network 100 across one or more intermediate networks 106 (e.g., the internet) via one or more interface(s) 104, such as through use of application programming interface (API) calls, via a console implemented as a website or application, etc. The interface(s) 104 may be part of, or serve as a front-end to, a control plane 102 of the provider network 100 that includes "backend" services supporting and enabling the services that may be more directly offered to customers.

To provide these and other computing resource services, provider networks 100 often rely upon virtualization techniques. For example, virtualization technologies may be used to provide users the ability to control or utilize compute instances (e.g., a VM using a guest operating system (O/S) that operates using a hypervisor that may or may not further operate on top of an underlying host O/S, a container that may or may not operate in a VM, an instance that can execute on "bare metal" hardware without an underlying hypervisor), where one or multiple compute instances can be implemented using a single electronic device. Thus, a user may directly utilize a compute instance (e.g., provided by a hardware virtualization service 108A) hosted by the provider network 100 to perform a variety of computing tasks. Additionally, or alternatively, a user may indirectly utilize a compute instance by submitting code to be executed by the provider network (e.g., via an on-demand code execution service 150), which in turn utilizes a compute instance to execute the code—typically without the user having any control of or knowledge of the underlying compute instance(s) involved.

For example, in various embodiments, a "serverless" function may include code provided by a user or other entity—such as the provider network itself—that can be executed on demand Serverless functions may be maintained within provider network 100 by an on-demand code execution service 150 and may be associated with a particular user or account or be generally accessible to multiple users/accounts. A serverless function may be associated with a Uniform Resource Locator (URL), Uniform Resource Identifier (URI), or other reference, which may be used to invoke the serverless function. A serverless function may be executed by a compute instance, such as a virtual machine, container, etc., when triggered or invoked. In some embodiments, a serverless function can be invoked through an application programming interface (API) call or a specially formatted HyperText Transport Protocol (HTTP) request message. Accordingly, users can define serverless functions that can be executed on demand, without requiring the user to maintain dedicated infrastructure to execute the serverless function. Instead, the serverless functions can be executed on demand using resources maintained by the provider network 100. In some embodiments, these resources may be maintained in a "ready" state (e.g., having a pre-initialized runtime environment configured to execute the serverless functions), allowing the serverless functions to be executed in near real-time.

A user 105 who seeks to deploy an application 111 with support for auto-scaled heterogeneous fleets 110 or who has already deployed an application 111 but seeks to enable heterogeneous auto-scaling may issue one or more requests with configuration information 115 as shown at circle (1) to do so. Generally, an application 111 may involve one or multiple types of different application components 116A-116X executed by one or multiple compute instances 112A-112N or 114A-114M. For example, a multi-tier application may include a first tier 113A with an application component 116A of a front-end web server application, where one or multiple copies of the application component 116A in this first tier 113A may be executed by one or multiple compute instances 112A-112N and/or 114A-114M. Similarly, another tier 113F such as a database tier may include one or multiple copies of a database engine application component 116X executed by one or multiple compute instances 112A-112N and/or 114A-114M.

As discussed herein, multiple "types" of compute instances 112/114 may be used to implement an application 111, where each type may provide at least one different amount or kind of computing resource (e.g., processing, memory, storage, bandwidth, and so on). However, an application 111 may start out using only one type of compute instance (e.g., only "type A" compute instances 112), which may be used for all application components 116 in one tier or in multiple tiers, or using multiple types of compute instances (e.g., a first type for a first tier and a second type for a second tier, or even multiple types within a single tier). Embodiments disclosed herein may adapt these applications over time to make use of different types of compute instances for periods of time and optionally may also cause the applications to make use of a same type of compute instance for other periods of time.

With regard to circle (1), a user 105 may utilize a computing device 107 to provide configuration information 115 to the scaling engine 118 for use in implementing heterogenous compute instance auto-scaling. For example, a client 109 executed by the computing device may render a graphical user interface (GUI) to the user 105, which may be implemented as part of a web application offered by the provider network 100 or as part of a special-purpose application. The GUI may allow the user 105 to provide input identifying the application 111 or its components, such as by providing an identifier of an already-deployed application 111. A user 105 may also provide or identify an application template or application framework template that specifies a set of application components of an application and their properties. This information may be included within the configuration information 115.

Application templates, generally, are created by users to describe all the provider network 100 resources for an application (e.g., compute instances provided by a hardware virtualization service 108A, database instances provided by a database service 108B, and the like), and the provider network 100 may use this template to take care of provisioning and configuring those resources on behalf of the user. For example, for a scalable web application that also includes a back-end database, a user may create an auto-scaling group, a load balancer, and a database service database instance. Instead of calling each individual service to provision these resources, and thereafter configuring these resources to work together, a user may instead create or modify an existing application template that describes all of the needed resources and their properties. The provider network 100 may then use that template to create and configure the resources for the user, e.g., including provisioning an auto-scaling group, load balancer, database, etc.

Via the client 109, the user 105 may also use user-interface elements to provide characteristics of the application 111, such as via a wizard. Thus, the user 105 may select a type of the application (e.g., a three-tier web application, a single-tier web-service, etc.) from a set of defined types, or select one or multiple components from a library of components, etc., to describe an architecture of the application 111. This information may be included within the configuration information 115.

As part of these operations, a user 105 may optionally also provide also provide traffic and/or execution information associated with (or describing) the actual or expected traffic loads and/or actual or expected performance characteristics of the application within the configuration information 115. For example, the user 105 may provide an identifier to a set of logs (e.g., maintained in a log system 121) that keeps track of metadata (and/or actual data) involving one or more of requests issued to the application 111 (or sent between components of the application) and/or processing characteristics of the components such as the time needed to process a request or perform some operation, the usage amounts of various computing resources over time (e.g., on a per-request basis, or at various points in time), etc.

The user 105 may also select or provide a reward function that is to be used to train a ML model 142 according to a reinforcement learning technique. As is known to those of skill in the art, in contrast to supervised learning approaches where data is provided that is labeled, reinforcement learning typically involves an agent that automatically learns from an environment based on use of a reward function. The agent interacts with the environment by applying an action and learning from a reward (typically a positive or negative value, such as an integer between −10 and +10 where agents attempt to seek a highest possible reward) awarded by the environment. Accordingly, at each time interval step, a current state of the environment is provided to the agent, which applies an action and receives a reward and the environment moves to a next state. The agent may choose the action based on a policy, where the objective of the agent is to learn the optimal policy to achieve a maximum long-term reward received over time. Thus, with each such interaction, a signal is effectively generated by the reward function that indicates whether the action taken in the environment is a good action or a bad action, and thus a desired behavior can be learned by seeking the highest reward at every step, and this logic can be encoded within the resultant model. Because RL models learn by a continuous process of receiving rewards and punishments for every action taken by the agent, it is possible to train systems to make decisions under uncertainty and in dynamic environments.

The reward function may be selected from a library of optionally configurable reward function templates, which may be based on one or more objectives such as minimizing the utilization of one or multiple computing resources associated with some or all instances of the application, minimizing an expected cost or credit usage associated with the application at a point in time or over a period of time, minimizing the number of changes made to the fleet for the application over time, etc. For example, an interface may be provided to the user via the client 109 allowing the user to select particular reward values under particular scenarios, and a controller 119 of the scaling engine may use those values to create a reward function based on a reward function template. As another example, an interface may be provided to the user via the client 109 allowing the user to select particular desired objectives and associated values— e.g., ensure a cost over a period of time falls beneath a threshold, ensure that a processing or memory utilization across a particular tier of the fleet remains beneath some threshold, etc.

Additionally, or alternatively, in some embodiments the user may use a user interface provided by the client 109 to write a reward function or upload a reward function that the user has created. A reward function may be written in a variety of types of programming languages, and may access parameters regarding the current and/or historic state of the application infrastructure via the simulation environment 128—e.g., identifiers of numbers and/or types of compute instances 112/114 used in the simulation environment 128 at a point in time or a recent period of time, identifiers of computing resource utilization levels (e.g., CPU utilization, memory utilization) at a point in time or a recent period of time, (e.g., current, maximum, minimum, etc.), identifiers of traffic/request loads associated with the entire application and/or particular components of the application at a point in time or a recent period of time, identifiers of credit usage or cost usage of the application at a point in time or a recent period of time, etc. These parameters may then be used within the provided reward function to determine a reward based on the desired autoscaling functionality sought by the user 105.

For example, the user 105 may desire to optimize for one concern or multiple concerns, such as reliability, cost, stability, etc. Reliability may be addressed by, for example, maximizing a number of requests that had associated successful responses (e.g., an HTTP response message with a "200 OK" success status response code indicating that the request has succeeded), minimizing a cost or keeping a cost of the application below a threshold, minimizing a number of changes to the fleet over time (via auto-scaling changes) to keep the application infrastructure as stable as possible, etc. Thus, a user may craft a reward function based on one or multiple ones of these concerns. For example, a reward function may encourage the addition of additional compute instances if it is helpful to reduce failures, and/or may consider cost to encourage the addition of a "right-sized" compute instance to select the least expensive compute instance type to add to handle the projected need, and/or may consider the amount of change to the fleet over time (e.g., to encourage not adding compute instances, or to add a sufficiently large compute instance or instances having particular resource amounts to satisfy upcoming projected need without needing to scale up again, etc.

With this configuration information 115, at circle (2) a controller 119 of the scaling engine 118 may send one or more commands to a training system 122 (optionally provided by a machine learning service 101, described later herein) to set up a ML model training system 120 to utilize a proper RL-based ML algorithm 124 together with an agent 126 and a corresponding simulation environment 128 to begin training a ML model 142 at circle (3). At this point, the training may begin and a variety of usage scenarios (e.g., based on historic traffic patterns identified by the user) may be explored via the simulation environment 128, and the agent 126 may explore a variety of actions based on a policy to add and/or remove particular compute instances—and especially, different types of compute instances—in the simulation. The usage scenarios may also explore different availabilities of types and/or numbers of compute instances that are available for use, and optionally may consider the cost (e.g., in terms of credits, which may be directly or indirectly based on a financial cost) associated with the compute instance types, which may further change over time.

The simulation can simulate a wide variety of different load characteristics, different occurrences that affect the system (e.g., failures), etc., allowing the model to explore a huge number of simulated scenarios, including ones that are very hard to create in the real world, which previously have been ignored by implementors of previous rule-based scaling systems due to these implementors not experiencing or contemplating such scenarios.

The simulation may include testing various generated traffic patterns, for example, by taking logs from a current application 111, such as load balancing logs, server logs, metrics, etc., to create base-level transactional characteristics in order to simulate traffic. In some embodiments, traffic corresponding to a set of edge case scenarios can be injected into this traffic to further generate good traffic patterns for testing. In some embodiments, a time-bound approach can be utilized that uses a subset of the historic data for training while keeping another subset of the historic data (as a "hold") for testing purposes to evaluate the system. Moreover, in some embodiments, portions of actual historic traffic (e.g., such as a few hours of traffic from load balancing logs) can be replayed as well.

In some embodiments, the simulation environment is setup as similar as possible to an existing application but in a sandbox type environment and the simulation is tested by sending actual traffic through this system. However, in some embodiments the simulation environment may be a pure simulation such as a set of mathematical models constructed based on an application. Based on the use of logging data from the actual application or a similar application, the simulation may be a model that is adapted to act similar to the application. For example, by determining how particular types of requests impact particular components of the application (in terms of resource utilization, timing requirements, etc.), these components can be modeled accordingly and the overall application can be modeled based on these component models. Such approaches can result in a multi-level understanding of the application, which may have several layers. Some types of requests may have an effect at web server tier of an application, while others may impact the database tier, etc. Thus, the application can be simulated to allow for the change in performance characteristics of components of the application as well as the overall application to be inferred as the load changes.

Figure 2:
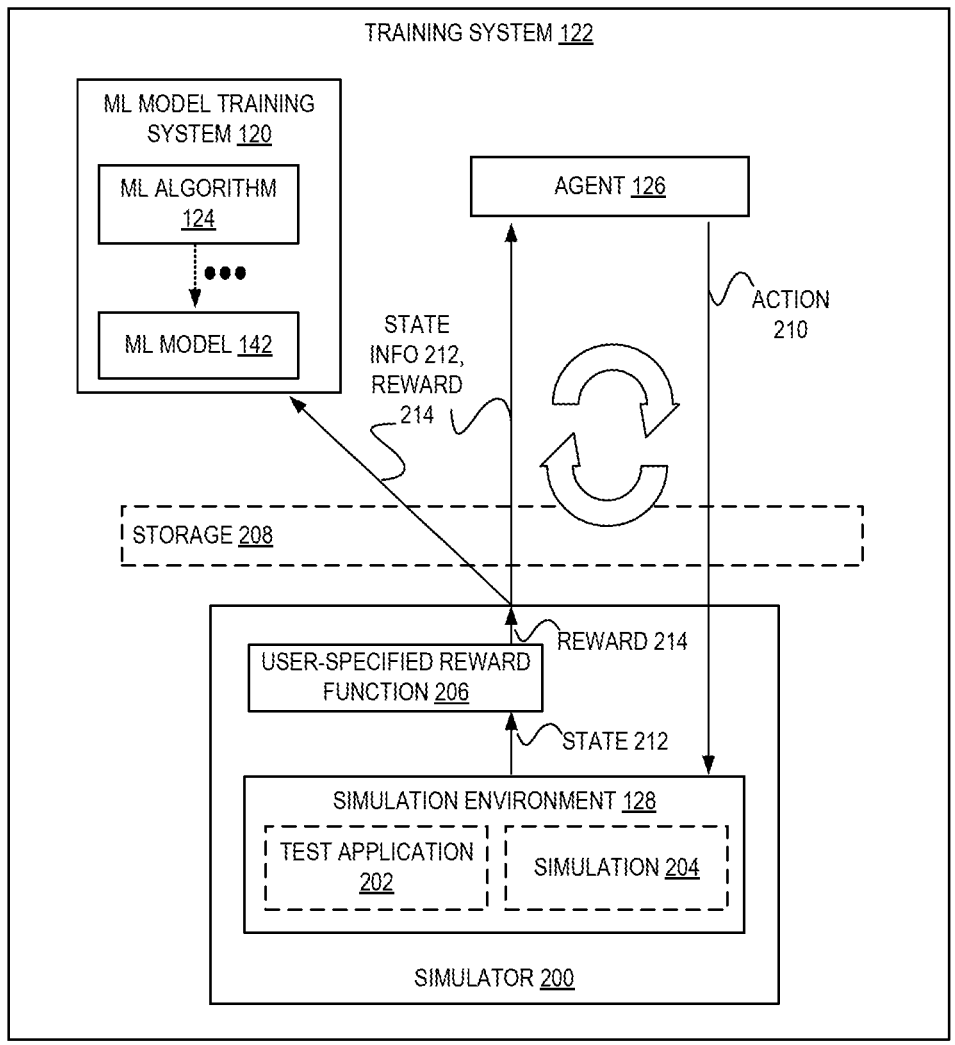
FIG. 2 is a diagram illustrating an environment for simulation-based ML model generation for heterogeneous compute instance auto-scaling with reinforcement learning according to some embodiments.

For further detail regarding the use of a simulation with reinforcement learning, FIG. 2 is a diagram illustrating an environment for simulation-based ML model generation for heterogeneous compute instance auto-scaling with reinforcement learning according to some embodiments. In this example environment, the training system 122 includes an agent 126 that receives state information 212 (and reward 214 information when there has been a previous action 210 taken by the agent 126), and based on the state information 212 decides on and issues an action 210—e.g., add one or more of a first type of compute instance, remove a particular instance, add multiple different types of compute instances, do nothing, etc.—to the simulator 200. The simulator 200 performs any needed actions as indicated by the action 210 in the simulation environment 128, which could be a test application 202 (e.g., a deployed version of the application within a sandbox environment) or a pure simulation 204. As a result, the state 212 of the simulation changes and is provided to a user-specified reward function 206, which may generate a reward 214. Again, the state 212 and reward 214 can be provided (either directly, or indirectly via storage 208) to the agent 126 for a next turn, as well as to the ML model training system 120 that can learn the effects of actions upon state and rewards using a RL algorithm 124 to train a ML model 142.

Figure 3:
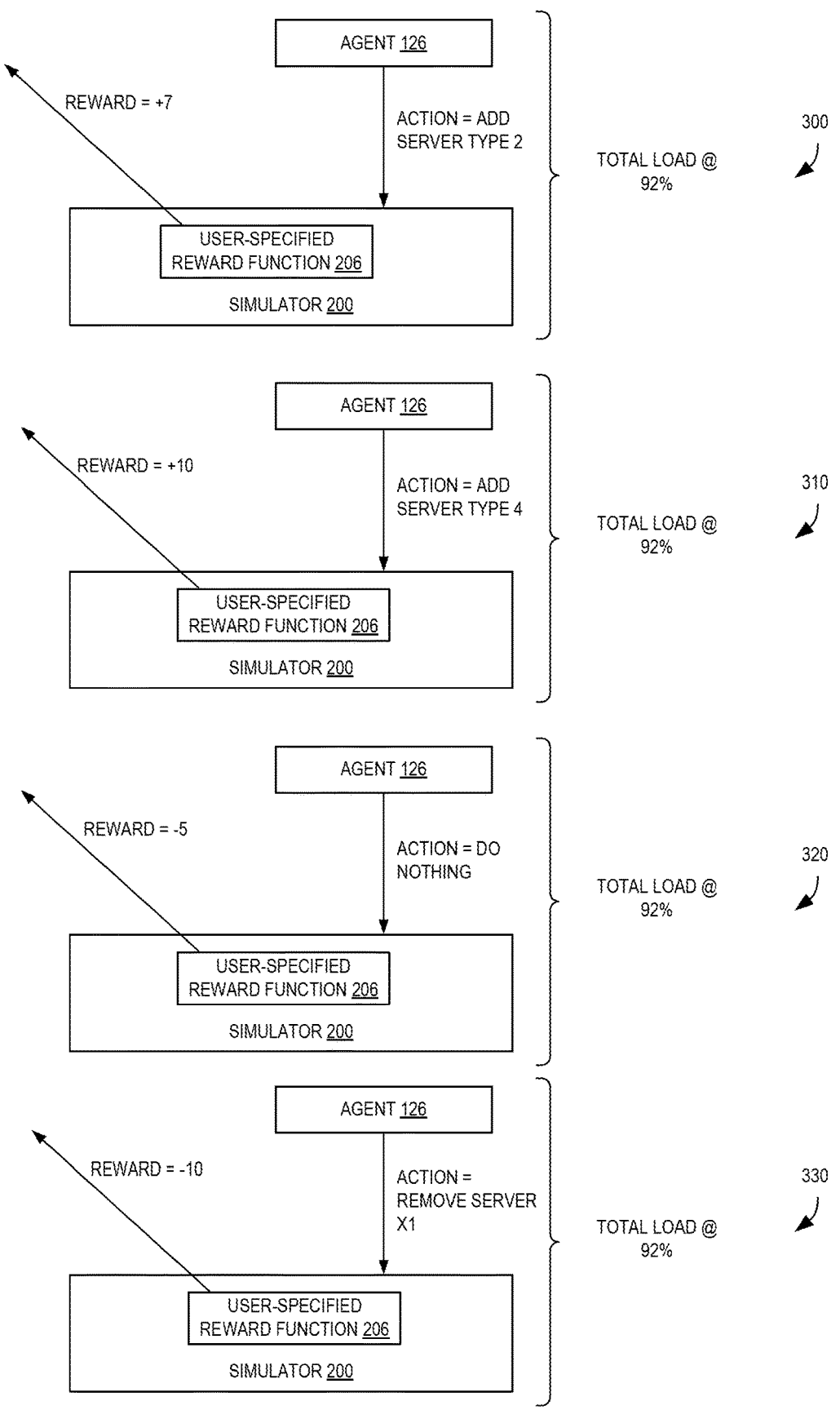
FIG. 3 is a diagram illustrating different actions involving heterogenous compute instances at a constant load and differing rewards generated by a user-specified reward function according to some embodiments.

FIG. 3 is a diagram illustrating different actions involving heterogenous compute instances at a constant load and differing rewards generated by a user-specified reward function according to some embodiments. For example, as shown at 300, when a simulated application currently has a state where some total load is at ninety-two percent, an agent 126 may determine to perform an action to reduce this load and thus, add a compute instance of a second type to the fleet. The user-specified reward function 206 may be crafted to reward this action fairly strongly as it may reward lowering the total load beneath some threshold—e.g., ninety percent or eighty-five percent. Thus, a positive reward of +7 may be issued by the user-specified reward function 206, where for the sake of example rewards fall within [−10, 10].

At 310, a same state may exist with a total load at ninety-two percent, and in this case the agent 126 may determine to perform an action to reduce this load and thus, add a compute instance of a fourth type to the fleet. For the sake of illustration, we assume that the fourth type of compute instance has significantly more resources in at least one dimension (processing, memory, bandwidth, storage, etc.) compared to instances of the second type. Assuming that this larger amount of at least one resource more clearly assists in reducing the load, the user-specified reward function 206 may issue a comparatively larger reward of +10 to indicate that this action was excellent.

Further, at 320 assuming a same state with a total load at ninety-two percent, in this case the agent 126 may determine to not perform any action, and thus this action may be granted a negative reward via the user-specified reward function 206 of −5, indicating that taking no action in this scenario is improper. Further, at 330, if the agent were instead to decide to remove a compute instance ("server X1") from the fleet, the user-specified reward function 206 may issue a stronger negative reward of −10.

Via this experimentation, the reinforcement learning approach can determine which particular actions involving different types of compute instances lead to a best result as indicated by the user-specified reward function 206 and embed this learned knowledge into a ML model.

Figure 4:
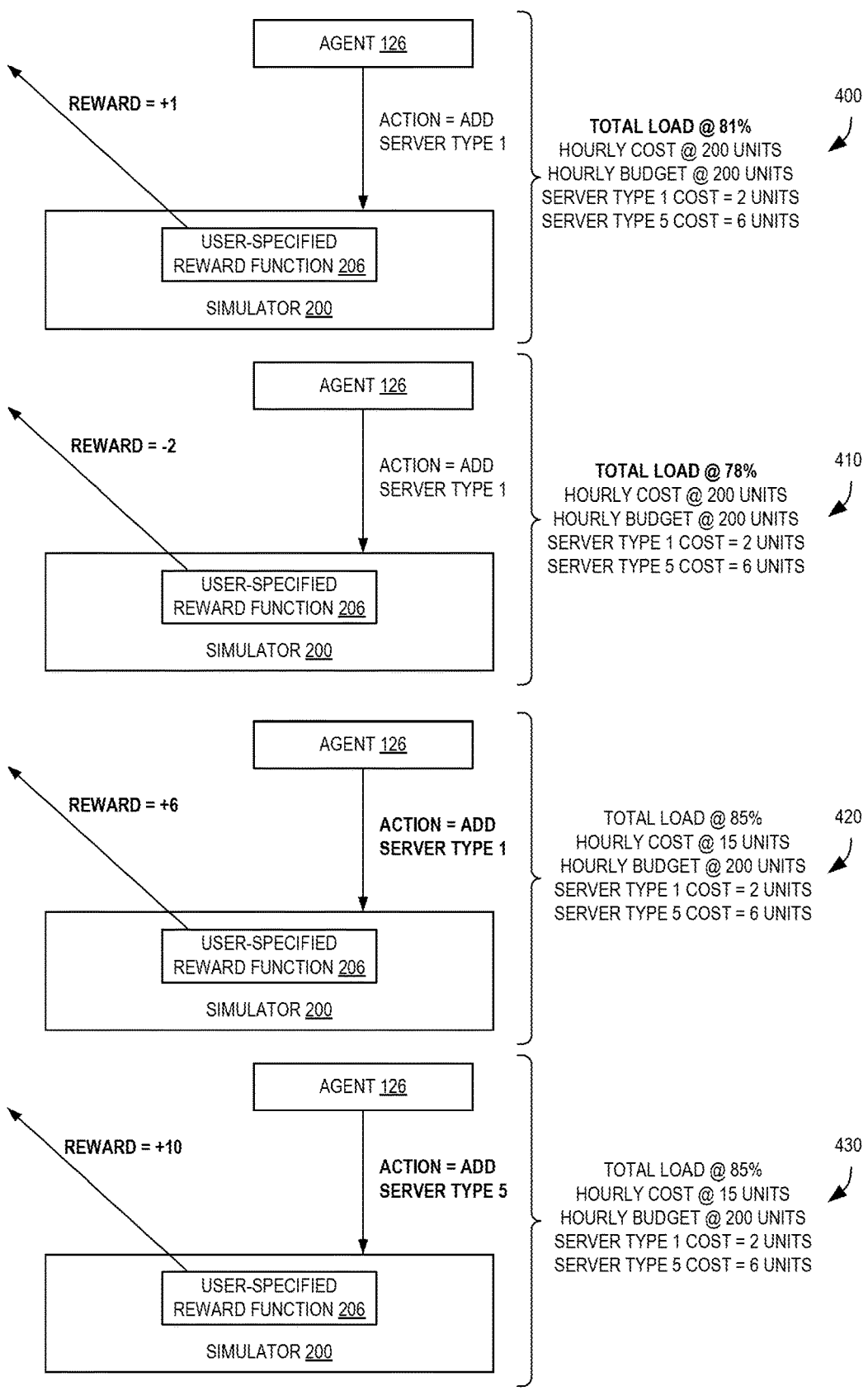
FIG. 4 is a diagram illustrating different actions involving heterogenous compute instances at differing loads and costs and differing rewards generated by a user-specified reward function according to some embodiments.

FIG. 4 is a diagram illustrating different actions involving heterogeneous compute instances at differing loads and costs and differing rewards generated by a user-specified reward function according to some embodiments. In these examples, multiple objectives involving maintaining a load threshold, reducing cost, and reducing fleet changes are embedded as part of the user-specified reward function 206, which results in differing rewards.

For example, at 400 the simulation is experiencing a load value of eighty-one percent and an hourly cost of two hundred units. Assuming that a load threshold desired to be maintained is approximately eighty percent, the fact that this threshold has been breached may lead to a positive reward for adding additional capacity (via the action of adding a compute instance of type "1"), though an hourly cost of two hundred units may similarly be at the cost threshold, weighing toward a likely small negative reward for adding additional cost via more instances. On balance, it may be the case that the user-specified reward function 206 has weighted the logic to result in a very small positive reward, and thus it is the case that keeping the load at or below the threshold (of eighty percent) must be slightly more important than staying under a cost threshold (of 200 units), especially as the addition may only marginally cause the hourly budget to be exceeded due to the selected compute instance type being only of a cost of two units.

At 410, in contrast, a same action may be weighted with a small negative reward of −2, as the total load of seventy-eight percent is just below the load threshold and the hourly cost is already at the cost threshold. Accordingly, adding additional capacity will result in this small negative reward due to a comparatively strong negative influence of exceeding the capacity that outweighs a potential small positive influence (or neutral influence) of adding more capacity to reduce load.

At 420, with a total load at eighty-five percent (which exceeds the desired load target threshold of eighty percent) and an hourly cost of fifteen units—far beneath the desired cost threshold of two hundred units—an action of adding a compute instance of type "1" is positive with a reward +6; however, at 430 a different action of adding a different type of compute instance (of type "5") results in a larger reward of +10, possibly due to that compute instance having resource(s) that much more effectively reduce load and/or provide substantial excess capacity for future traffic, which may be reflected in logic directed toward maintaining a low rate of application change and/or being able to accommodate predicted traffic.

FIG. 5 is a diagram illustrating an exemplary user-specified reward function 500 according to some embodiments. As indicated herein, users may select or write their own reward function 500 to control how the scaling of their application is to be carried out based on any of a variety of factors. For example, the example pseudocode reward function 500 includes some threshold definitions 505 where a user has specified particular thresholds associated with the application of concern—here, a total load threshold and a cost threshold, though other thresholds may be used in other scenarios.

The example pseudocode reward function 500 also includes an example removal action reward logic 510 block specifying rewards to be assigned when an agent has performed an action to remove at least one computing instance from the fleet. In this simple example, a number of different rewards are returned based on the current load and the defined load threshold.

The example pseudocode reward function 500 also includes a snippet of logic 515 that is specific to the type of instance(s) that the agent added to the fleet. Using similar logic, rewards can be crafted based on what instance types were added, and thus how much additional resource capacity was added to the fleet, additional cost, etc.

Turning back to FIG. 1, in some embodiments, upon satisfactory completion of training of a ML model 142, the machine learning service 101 may deploy the ML model 142 behind an endpoint 143 as part of a machine learning model hosting system 140 at circle (4), which may optionally occur via a request issued by the controller 119 upon detecting that the ML model 142 has been trained and is satisfactory for use, or the machine learning service 101 may do the deployment on its own upon completion of training. For example, these operations may include obtaining model artifacts created by the training system 120 from a storage location, launching an instance (e.g., a container or virtual machine) having code to run inference against the model, creating an endpoint configuration for the endpoint to cause the endpoint to send received inference requests to the compute instance(s) hosting the model and send back inference results generated by the compute instance(s) to the clients, etc. The endpoint may be a secured endpoint such as an HTTPS endpoint. Upon successful deployment, client applications may send inference requests to the endpoint to retrieve inferences from the deployed model.

As shown in FIG. 1, a scaling driver 123 of the scaling engine 118 can monitor the entire infrastructure of the application 111 at circle (5) by obtaining operational metrics 151 to generate aggregated state information. For example, the operational metrics 151 may include performance metrics associated with the entire application and/or portions of the application (e.g., pertaining to individual compute instances) and/or traffic metric information describing the traffic coming into the application, sent out of the application, and/or sent between components of the application. Based on the operational metrics, aggregated state information may be generated and include data or metadata associated with the requests coming into the application, sent between components of the application, resource load characteristics of all the instances of the application, etc. The scaling driver 123 may be executed as a serverless function, for example, by an on-demand code execution service 150 or executed as a traditional application. The scaling driver 123, in some embodiments, is executed periodically according to a schedule—e.g., every minute, every five minutes, every fifteen minutes, etc.

For example, the operational metrics 151 obtained at circle (5) may include obtaining logging information from one or more logging systems 121 of the provider network 100, which may include load balancing logs 123A detailing requests and/or responses sent between clients and the application (and optionally messaging sent between application components 116 of the application). The operational metrics 151 obtained at circle (5) may also include performance metrics from a metrics logging system detailing resource utilization characteristics of the compute instances, for example, each instance's usage of processing, memory, network, storage, etc., at one or more points in time.

The monitoring of the application infrastructure at circle (5), in some embodiments, includes obtaining compute instance availability information from an availability system 125 of the hardware virtualization service 108A. As detailed herein, in some embodiments the numbers and/or types of compute instances available for use may change over time and/or may have different prices or costs associated with their use over time. For example, in some embodiments a provider network 100 may make certain compute instances available for use at a smaller rate (e.g., requiring fewer credits or monetary units) at various points in time, perhaps with no guarantee as to the ability for users to continue using these instances indefinitely (e.g., users may be evicted from using such "excess" instances at these lower rates when "regular" demand for these types of instances increases). Thus, as part of circle (5), the scaling driver 123 may obtain availability information identifying types of available compute instances (e.g., excess compute instances) and optionally the associated charge (e.g., credits, money) for use of these instances.

Data from some or all of these sources may be consolidated by the scaling driver 123 into a "state" object (or set of values) that can be sent in an inference request sent to the endpoint 143 and ultimately provided to the ML model 142 at circle (6), which can use this state information to determine whether one or more additional compute instances should be added to the fleet 110, one or more compute instances should be removed from the fleet 110, or no action should be performed. Thus, the inference result sent back to the scaling driver 123 at circle (6) may include identifiers of these actions. The scaling driver 123 may then analyze the inference result, and if any changes to the fleet are needed (e.g., the addition or removal of one or more compute instances) the scaling driver at circle (7) may cause these changes to be affected.

For example, the scaling driver 123 may send one or more requests to the hardware virtualization service 108A or other service(s) 108B (such as a database service) to utilize autoscaling functionalities to add or remove instances to an autoscaling group or groups associated with the application 111. As another example, the scaling driver 123 may send direct API calls to the hardware virtualization service 108A (or another service or services 108B of the provider network 100, such as a database service) to add or remove compute instances (or capacity) and/or configure these compute instances for use by issuing other API calls (e.g., to configure or reconfigure networking, access control, etc.) for the application 111.

In some embodiments, the scaling engine 118 may further trigger a retraining of the ML model 142. For example, the scaling engine 118 may monitor the performance of the scaling driver 123 and/or log system 121 logs over time, and if the performance of the ML model 142 falls beneath a threshold (e.g., due to changes in the usage of the application or of the application itself), the controller 119 may again setup a training (via circles (3) and (4)) to create an updated model.

Additionally, or alternatively, in some embodiments the scaling driver 123 performs the monitoring operations at circle (5) and the inference operations at circle (6) and, upon determining that a change to the fleet 110 or application 111 is required, may wait instead of immediately changing the fleet/application. For example, in some embodiments the scaling driver 123 may wait a threshold number of monitoring "cycles" to determine whether an action to, e.g., scale up or scale down the application is a correct action. This can help avoid "thrashing" the application (by changing it back and forth) due to incorrect predictions of future load changes, temporary issues with the application 111, and so on. By way of example, the scaling driver 123 may determine a need to add or remove an additional compute instance to/from a fleet but may wait for one or more additional determinations (also indicating such a need, or a similar need) before acting. This can eliminate the incorrect action of scaling up or down a fleet, for example, due to a momentary issue that does not become a continuing one.

Moreover, in some embodiments the scaling driver 123 may utilize the inference results provided by the ML model 142 at a particular rate, which may vary over time. For example, upon the ML model 142 initially being deployed, the scaling driver 123 may only act on a first percentage of its recommendations (e.g., a relatively low percentage, such as 1% or 5% or 10%) and optionally increase this percentage over time. This can allow the influence of the ML model 142 to be slowly applied over time, preventing a "buggy" model from harming the application. In some embodiments, the scaling driver 123 may track the non-acted-upon inferences provided by the ML model 142 to determine whether those recommendations were good or bad—e.g., by taking note of a recommendation to add a compute instance, and then later—based on actual activity/performance of the application—determining whether that recommendation would have helped or hurt. If the recommendation would have been beneficial, the scaling driver 123 may increase the percentage of inferences from the ML model that it acts upon (e.g., from 10% to 15% or 20%). If the recommendation would have been detrimental, the scaling driver 123 may keep the percentage the same or decrease the percentage of inferences from the ML model that it acts upon (e.g., from 20% to 10%). In some scenarios, the scaling driver 123 may continually adjust this percentage over time to dynamically utilize the ML model's inferences, though in some embodiments the scaling driver 123 may use such a scheme to on-board a model and halt this dynamic adjustment when at some point (e.g., 100% use, 90% use).

In some embodiments using this dynamic use of the ML model's inferences, a retraining threshold may be implemented by the scaling driver 123 to determine a particular percentage use rate (e.g., <10%)—seen for one period, or for some number of recent periods—that will trigger a retraining of the ML model 142. As traffic patterns and/or the application itself changes over time, a slow or sudden degradation of the utility of the model may occur that may be reflected via this percentage. Thus, a percentage use rate may dip below the threshold, which indicates that the model is no longer helpful in the current environment, and the model can be automatically retrained with more recent data, leading to a better-performing model and thus, application.

Figure 6:
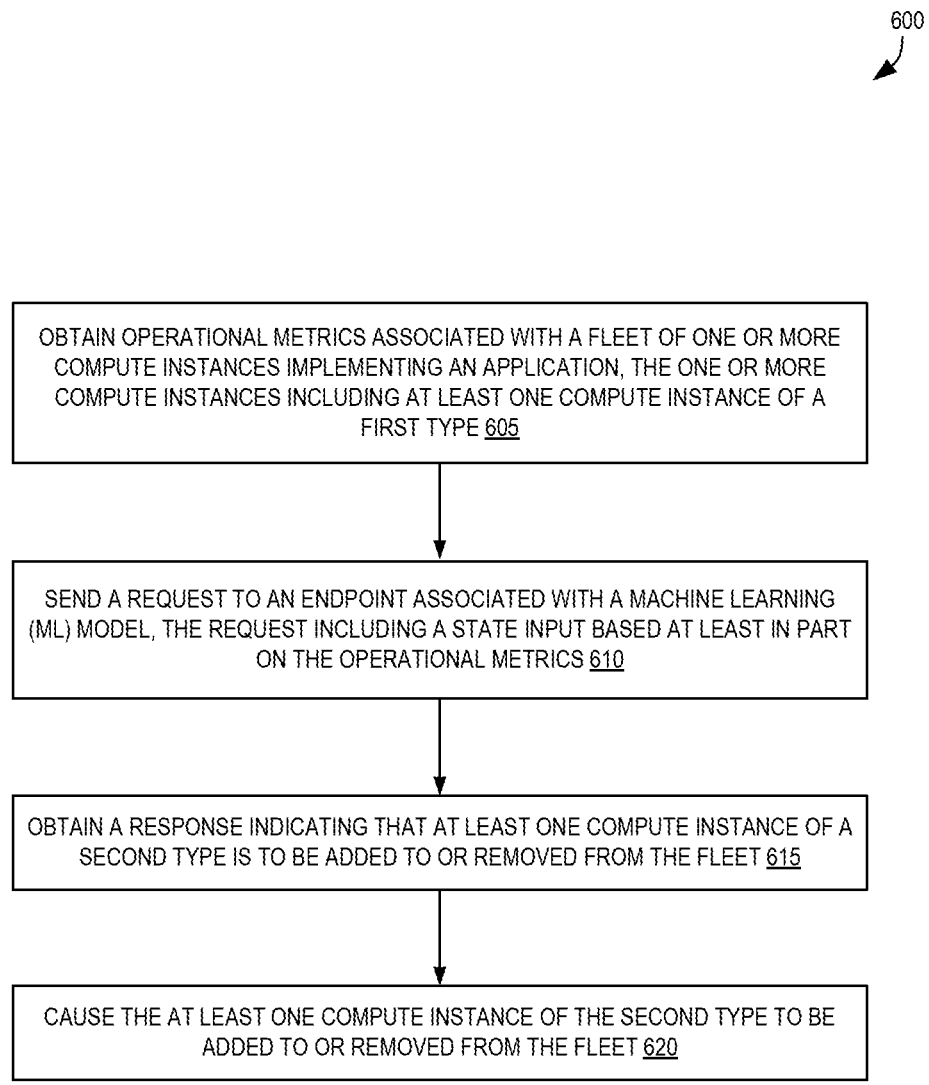
FIG. 6 is a flow diagram illustrating operations of a method for heterogeneous compute instance auto-scaling with reinforcement learning according to some embodiments.

FIG. 6 is a flow diagram illustrating operations 600 of a method for heterogeneous compute instance auto-scaling with reinforcement learning according to some embodiments. Some or all of the operations 600 (or other processes described herein, or variations, and/or combinations thereof) are performed under the control of one or more computer systems configured with executable instructions and are implemented as code (e.g., executable instructions, one or more computer programs, or one or more applications) executing collectively on one or more processors, by hardware or combinations thereof. The code is stored on a computer-readable storage medium, for example, in the form of a computer program comprising instructions executable by one or more processors. The computer-readable storage medium is non-transitory. In some embodiments, one or more (or all) of the operations 600 are performed by the scaling engine 118 of the other figures.

The operations 600 include, at block 605, obtaining operational metrics associated with a fleet of one or more compute instances implementing an application, the one or more compute instances including at least one compute instance of a first type. The operational metrics may include performance metrics associated with the compute instances and/or traffic information involving the application. The operational metrics may be obtained from a log system of a provider network that collects metrics information from the fleet of one or more compute instances implementing the application, and may include load metrics related to computing resources such as processing utilization, memory utilization, storage utilization, bandwidth utilization, etc. Block 605 may also include obtaining traffic information describing requests issued to the application by other clients and/or describing responses generated by the application responsive to the requests and/or describing traffic sent between components of the application (e.g., between compute instances of the application).

The operations 600 further include, at block 610, sending a request to an endpoint associated with a machine learning (ML) model, the request including a state input based at least in part on the operational metrics. In some embodiments, the state input is further based at least in part on the traffic information.

The operations 600 further include, at block 615, obtaining a response indicating that at least one compute instance of a second type is to be added to or removed from the fleet. In some embodiments, the second type of compute instance comprises at least one different computing resource amount than the corresponding computing resource amount provided by the first type of compute instance, wherein the computing resource amount is: a number of virtual processors or processing cores; an amount of volatile memory; an amount of non-volatile memory; an amount of networking bandwidth; or any combination thereof.

At block 620, the operations 600 further include causing the at least one compute instance of the second type to be added to or removed from the fleet.

In some embodiments, the operations 600 further include receiving, from a computing device associated with a user, a reward function or an identifier of the reward function; and training the ML model based at least in part on a simulation of the application and the reward function. In some embodiments, the reward function is based at least in part on a resource utilization associated with the one or more compute instances of the fleet. In some embodiments, the reward function is further based at least in part on a number of compute instances belonging to the fleet over an amount of time.

In some embodiments, the operations 600 further include deploying the ML model, comprising causing the endpoint to be configured to send inference requests received at the endpoint to a compute instance hosting the ML model.

In some embodiments, the operations 600 further include obtaining an application template that identifies a structure of the application; and deploying, based at least in part on the application template, the application to a simulation environment. In some embodiments, the operations 600 further include obtaining one or more traffic logs associated with the application, wherein training the ML model comprises sending test traffic to the application within the simulation environment, wherein the test traffic is generated based at least in part on an analysis of the one or more traffic logs.

In some embodiments, obtaining the operational metrics, sending the request to the endpoint, obtaining the response, and causing the at least one compute instance of the second type to be added to the fleet are performed by one or more serverless functions implemented by an on-demand code execution service of a multi-tenant provider network; and the fleet of one or more compute instances implementing the application are implemented within the multi-tenant provider network.

In some embodiments, the application is a three-tier web application, wherein the fleet of one or more compute instances implementing the application implement at least one or more web servers and one or more database servers. In some embodiments, the at least one compute instance of the first type and the at least one compute instance of the second type belong to a same tier of the three-tier web application.

Figure 7:
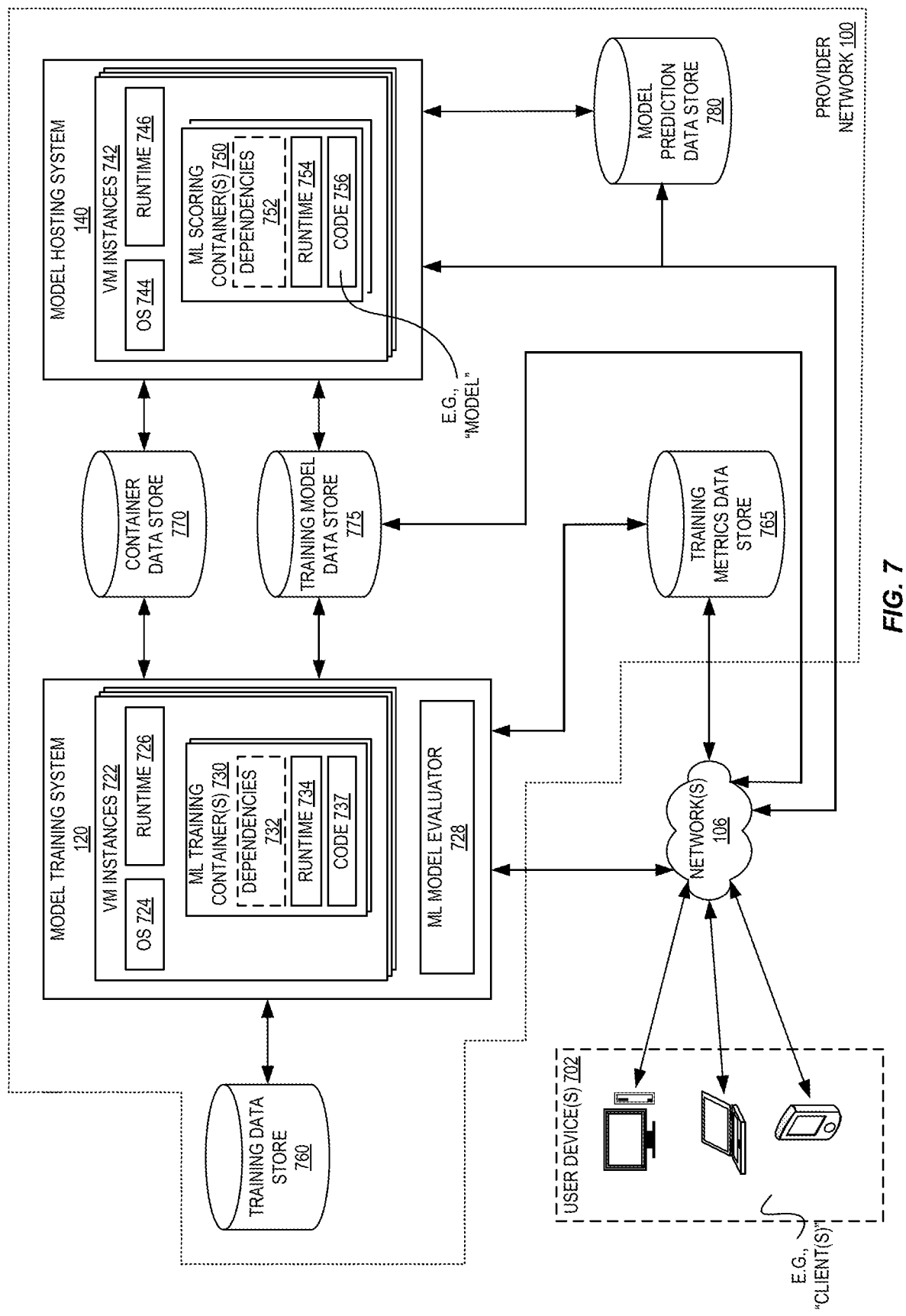
FIG. 7 is a block diagram of an illustrative operating environment in which machine learning models are trained and hosted according to some embodiments.

FIG. 7 is a block diagram of an illustrative operating environment in which machine learning models are trained and hosted according to some embodiments. The operating environment includes end user devices 702 (e.g., a PC or mobile device, such as computing device 107), a model training system 120, a model hosting system 140, a training data store 760, a training metrics data store 765, a container data store 770, a training model data store 775, and a model prediction data store 780. A machine learning service 101 described herein may include one or more of these entities, such as the model hosting system 140, model training system 120, etc.

In some embodiments, users, by way of user devices 702, interact with the model training system 120 to provide data that causes the model training system 120 to train one or more machine learning models. A machine learning model, generally, may be thought of as one or more equations that are "trained" using a set of data according to an algorithm (e.g., linear regression, logistic regression, k-means clustering, principal component analysis, factorization machines, neural topic modeling, latent dirichlet allocation, gradient boosted trees, time series forecasting, image classification, etc.). In some embodiments, the model training system 120 provides ML functionalities as a Web service, and thus messaging between user devices 702 and the model training system 120 (or provider network 100), and/or between components of the model training system 120 (or provider network 100), may utilize HTTP messages to transfer data in a machine-readable file format, such as eXtensible Markup Language (XML) or JavaScript Object Notation (JSON).

The user devices 702 can interact with the model training system 120 via frontend 729 of the model training system 120. For example, a user device 702 can provide a training request to the frontend 729 that includes a container image (or multiple container images, or an identifier of one or multiple locations where container images are stored), an indicator of input data (e.g., an address or location of input data), one or more hyperparameter values (e.g., values indicating how the algorithm will operate, how many algorithms to run in parallel, how many clusters into which to separate data, etc.), and/or information describing the computing machine on which to train a machine learning model (e.g., a graphical processing unit (GPU) instance type, a central processing unit (CPU) instance type, an amount of memory to allocate, a type of virtual machine instance to use for training, etc.).

In some embodiments, the container image can include one or more layers, where each layer represents an executable instruction. Some or all of the executable instructions together represent an algorithm that is used to define a machine learning model. The executable instructions (e.g., the algorithm) can be written in any programming language (e.g., Python, Ruby, C++, Java, etc.). In some embodiments, the algorithm is pre-generated and obtained by a user, via the user device 702, from an algorithm repository (e.g., a network-accessible marketplace, a data store provided by a machine learning training service, etc.). In some embodiments, the algorithm is completely user-generated or partially user-generated (e.g., user-provided code modifies or configures existing algorithmic code).

In some embodiments, instead of providing a container image (or identifier thereof) in the training request, the user device 702 may provide, in the training request, an algorithm written in any programming language. The model training system 120 packages the algorithm into a container (optionally with other code, such as a "base" ML algorithm supplemented with user-provided code) that is eventually loaded into a virtual machine instance 722 for training a machine learning model, as described in greater detail below. For example, a user, via a user device 702, may develop an algorithm/code using an application (e.g., an interactive web-based programming environment) and cause the algorithm/code to be provided—perhaps as part of a training request (or referenced in a training request)—to the model training system 120, where this algorithm/code may be containerized on its own or used together with an existing container having a machine learning framework, for example.

In some embodiments, instead of providing a container image in the training request, the user device 702 provides, in the training request, an indicator of a container image (e.g., an indication of an address or a location at which a container image is stored). For example, the container image can be stored in a container data store 770, and this container image may have been previously created/uploaded by the user. The model training system 120 can retrieve the container image from the indicated location and create a container using the retrieved container image. The container is then loaded into a virtual machine instance 722 for training a machine learning model, as described in greater detail below.

The model training system 120 can use the information provided by the user device 702 to train a machine learning model in one or more pre-established virtual machine instances 722 in some embodiments. In particular, the model training system 120 includes a single physical computing device or multiple physical computing devices that are interconnected using one or more computing networks (not shown), where the physical computing device(s) host one or more virtual machine instances 722. The model training system 120 can handle the acquisition and configuration of compute capacity (e.g., containers, instances, etc., which are described in greater detail below) based on the information describing the computing machine on which to train a machine learning model provided by the user device 702. The model training system 120 can then train machine learning models using the compute capacity, as is described in greater detail below. The model training system 120 can automatically scale up and down based on the volume of training requests received from user devices 702 via frontend 729, thereby relieving the user from the burden of having to worry about over-utilization (e.g., acquiring too little computing resources and suffering performance issues) or under-utilization (e.g., acquiring more computing resources than necessary to train the machine learning models, and thus overpaying).

In some embodiments, the virtual machine instances 722 are utilized to execute tasks. For example, such tasks can include training a machine learning model. As shown in FIG. 7, each virtual machine instance 722 includes an operating system (OS) 724, a language runtime 726, and one or more ML training containers 730. Generally, the ML training containers 730 are logical units created within a virtual machine instance using the resources available on that instance and can be utilized to isolate execution of a task from other processes (e.g., task executions) occurring in the instance. In some embodiments, the ML training containers 730 are formed from one or more container images and a top container layer. Each container image may further include one or more image layers, where each image layer represents an executable instruction. As described above, some or all of the executable instructions together represent an algorithm that defines a machine learning model. Changes made to the ML training containers 730 (e.g., creation of new files, modification of existing files, deletion of files, etc.) are stored in the top container layer. If a ML training container 730 is deleted, the top container layer is also deleted. However, the container image(s) that form a portion of the deleted ML training container 730 can remain unchanged. The ML training containers 730 can be implemented, for example, as Linux containers (LXC), Docker containers, and the like.

The ML training containers 730 may include individual a runtime 734, code 737, and dependencies 732 needed by the code 737 in some embodiments. The runtime 734 can be defined by one or more executable instructions that form at least a portion of a container image that is used to form the ML training container 730 (e.g., the executable instruction(s) in the container image that define the operating system and/or runtime to run in the container formed from the container image). The code 737 includes one or more executable instructions that form at least a portion of a container image that is used to form the ML training container 730. For example, the code 737 includes the executable instructions in the container image that represent an algorithm that defines a machine learning model, which may reference (or utilize) code or libraries from dependencies 732. The runtime 734 is configured to execute the code 737 in response to an instruction to begin machine learning model training. Execution of the code 737 results in the generation of model data, as described in greater detail below.

In some embodiments, the code 737 includes executable instructions that represent algorithms that define different machine learning models. For example, the code 737 includes one set of executable instructions that represent a first algorithm that defines a first machine learning model and a second set of executable instructions that represent a second algorithm that defines a second machine learning model. In some embodiments, the virtual machine instance 722 executes the code 737 and trains all of the machine learning models. In some embodiments, the virtual machine instance 722 executes the code 737, selecting one of the machine learning models to train. For example, the virtual machine instance 722 can identify a type of training data indicated by the training request and select a machine learning model to train (e.g., execute the executable instructions that represent an algorithm that defines the selected machine learning model) that corresponds with the identified type of training data.

In some embodiments, the runtime 734 is the same as the runtime 726 utilized by the virtual machine instance 722. In some embodiments, the runtime 734 is different than the runtime 726 utilized by the virtual machine instance 722.

In some embodiments, the model training system 120 uses one or more container images included in a training request (or a container image retrieved from the container data store 770 in response to a received training request) to create and initialize a ML training container 730 in a virtual machine instance 722. For example, the model training system 120 creates a ML training container 730 that includes the container image(s) and/or a top container layer.

Prior to beginning the training process, in some embodiments, the model training system 120 retrieves training data from the location indicated in the training request. For example, the location indicated in the training request can be a location in the training data store 760. Thus, the model training system 120 retrieves the training data from the indicated location in the training data store 760. In some embodiments, the model training system 120 does not retrieve the training data prior to beginning the training process. Rather, the model training system 120 streams the training data from the indicated location during the training process. For example, the model training system 120 can initially retrieve a portion of the training data and provide the retrieved portion to the virtual machine instance 722 training the machine learning model. Once the virtual machine instance 722 has applied and used the retrieved portion or once the virtual machine instance 722 is about to use all of the retrieved portion (e.g., a buffer storing the retrieved portion is nearly empty), then the model training system 120 can retrieve a second portion of the training data and provide the second retrieved portion to the virtual machine instance 722, and so on.

To perform the machine learning model training, the virtual machine instance 722 executes code 737 stored in the ML training container 730 in some embodiments. For example, the code 737 includes some or all of the executable instructions that form the container image of the ML training container 730 initialized therein. Thus, the virtual machine instance 722 executes some or all of the executable instructions that form the container image of the ML training container 730 initialized therein to train a machine learning model. The virtual machine instance 722 executes some or all of the executable instructions according to the hyperparameter values included in the training request. As an illustrative example, the virtual machine instance 722 trains a machine learning model by identifying values for certain parameters (e.g., coefficients, weights, centroids, etc.). The identified values depend on hyperparameters that define how the training is performed. Thus, the virtual machine instance 722 can execute the executable instructions to initiate a machine learning model training process, where the training process is run using the hyperparameter values included in the training request. Execution of the executable instructions can include the virtual machine instance 722 applying the training data retrieved by the model training system 120 as input parameters to some or all of the instructions being executed.

In some embodiments, executing the executable instructions causes the virtual machine instance 722 (e.g., the ML training container 730) to generate model data. For example, the ML training container 730 generates model data and stores the model data in a file system of the ML training container 730. The model data includes characteristics of the machine learning model being trained, such as a number of layers in the machine learning model, hyperparameters of the machine learning model, coefficients of the machine learning model, weights of the machine learning model, and/or the like. In particular, the generated model data includes values for the characteristics that define a machine learning model being trained. In some embodiments, executing the executable instructions causes a modification to the ML training container 730 such that the model data is written to the top container layer of the ML training container 730 and/or the container image(s) that forms a portion of the ML training container 730 is modified to include the model data.

The virtual machine instance 722 (or the model training system 120 itself) pulls the generated model data from the ML training container 730 and stores the generated model data in the training model data store 775 in an entry associated with the virtual machine instance 722 and/or the machine learning model being trained. In some embodiments, the virtual machine instance 722 generates a single file that includes model data and stores the single file in the training model data store 775. In some embodiments, the virtual machine instance 722 generates multiple files during the course of training a machine learning model, where each file includes model data. In some embodiments, each model data file includes the same or different model data information (e.g., one file identifies the structure of an algorithm, another file includes a list of coefficients, etc.). The virtual machine instance 722 can package the multiple files into a single file once training is complete and store the single file in the training model data store 775. Alternatively, the virtual machine instance 722 stores the multiple files in the training model data store 775. The virtual machine instance 722 stores the file(s) in the training model data store 775 while the training process is ongoing and/or after the training process is complete.

In some embodiments, the virtual machine instance 722 regularly stores model data file(s) in the training model data store 775 as the training process is ongoing. Thus, model data file(s) can be stored in the training model data store 775 at different times during the training process. Each set of model data files corresponding to a particular time or each set of model data files present in the training model data store 775 as of a particular time could be checkpoints that represent different versions of a partially-trained machine learning model during different stages of the training process. Accordingly, before training is complete, a user, via the user device 702 can submit a deployment and/or execution request in a manner as described below to deploy and/or execute a version of a partially trained machine learning model (e.g., a machine learning model trained as of a certain stage in the training process). A version of a partially-trained machine learning model can be based on some or all of the model data files stored in the training model data store 775.

In some embodiments, a virtual machine instance 722 executes code 737 stored in a plurality of ML training containers 730. For example, the algorithm included in the container image can be in a format that allows for the parallelization of the training process. Thus, the model training system 120 can create multiple copies of the container image provided in a training request and cause the virtual machine instance 722 to load each container image copy in a separate ML training container 730. The virtual machine instance 722 can then execute, in parallel, the code 737 stored in the ML training containers 730. The virtual machine instance 722 can further provide configuration information to each ML training container 730 (e.g., information indicating that N ML training containers 730 are collectively training a machine learning model and that a particular ML training container 730 receiving the configuration information is ML training container 730 number X of N), which can be included in the resulting model data. By parallelizing the training process, the model training system 120 can significantly reduce the training time in some embodiments.

In some embodiments, a plurality of virtual machine instances 722 execute code 737 stored in a plurality of ML training containers 730. For example, the resources used to train a particular machine learning model can exceed the limitations of a single virtual machine instance 722. However, the algorithm included in the container image can be in a format that allows for the parallelization of the training process. Thus, the model training system 120 can create multiple copies of the container image provided in a training request, initialize multiple virtual machine instances 722, and cause each virtual machine instance 722 to load a container image copy in one or more separate ML training containers 730. The virtual machine instances 722 can then each execute the code 737 stored in the ML training containers 730 in parallel. The model training system 120 can further provide configuration information to each ML training container 730 via the virtual machine instances 722 (e.g., information indicating that N ML training containers 730 are collectively training a machine learning model and that a particular ML training container 730 receiving the configuration information is ML training container 730 number X of N, information indicating that M virtual machine instances 722 are collectively training a machine learning model and that a particular ML training container 730 receiving the configuration information is initialized in virtual machine instance 722 number Y of M, etc.), which can be included in the resulting model data. As described above, by parallelizing the training process, the model training system 120 can significantly reduce the training time in some embodiments.

In some embodiments, the model training system 120 includes a plurality of physical computing devices and two or more of the physical computing devices hosts one or more virtual machine instances 722 that execute the code 737. Thus, the parallelization can occur over different physical computing devices in addition to over different virtual machine instances 722 and/or ML training containers 730.

In some embodiments, the model training system 120 includes a ML model evaluator 728. The ML model evaluator 728 can monitor virtual machine instances 722 as machine learning models are being trained, obtaining the generated model data and processing the obtained model data to generate model metrics. For example, the model metrics can include quality metrics, such as an error rate of the machine learning model being trained, a statistical distribution of the machine learning model being trained, a latency of the machine learning model being trained, a confidence level of the machine learning model being trained (e.g., a level of confidence that the accuracy of the machine learning model being trained is known, etc. The ML model evaluator 728 can obtain the model data for a machine learning model being trained and evaluation data from the training data store 760. The evaluation data is separate from the data used to train a machine learning model and includes both input data and expected outputs (e.g., known results), and thus the ML model evaluator 728 can define a machine learning model using the model data and execute the machine learning model by providing the input data as inputs to the machine learning model. The ML model evaluator 728 can then compare the outputs of the machine learning model to the expected outputs and determine one or more quality metrics of the machine learning model being trained based on the comparison (e.g., the error rate can be a difference or distance between the machine learning model outputs and the expected outputs).

The ML model evaluator 728 periodically generates model metrics during the training process and stores the model metrics in the training metrics data store 765 in some embodiments. While the machine learning model is being trained, a user, via the user device 702, can access and retrieve the model metrics from the training metrics data store 765. The user can then use the model metrics to determine whether to adjust the training process and/or to stop the training process. For example, the model metrics can indicate that the machine learning model is performing poorly (e.g., has an error rate above a threshold value, has a statistical distribution that is not an expected or desired distribution (e.g., not a binomial distribution, a Poisson distribution, a geometric distribution, a normal distribution, Gaussian distribution, etc.), has an execution latency above a threshold value, has a confidence level below a threshold value)) and/or is performing progressively worse (e.g., the quality metric continues to worsen over time). In response, in some embodiments, the user, via the user device 702, can transmit a request to the model training system 120 to modify the machine learning model being trained (e.g., transmit a modification request). The request can include a new or modified container image, a new or modified algorithm, new or modified hyperparameter(s), and/or new or modified information describing the computing machine on which to train a machine learning model. The model training system 120 can modify the machine learning model accordingly. For example, the model training system 120 can cause the virtual machine instance 722 to optionally delete an existing ML training container 730, create and initialize a new ML training container 730 using some or all of the information included in the request, and execute the code 737 stored in the new ML training container 730 to restart the machine learning model training process. As another example, the model training system 120 can cause the virtual machine instance 722 to modify the execution of code stored in an existing ML training container 730 according to the data provided in the modification request. In some embodiments, the user, via the user device 702, can transmit a request to the model training system 120 to stop the machine learning model training process. The model training system 120 can then instruct the virtual machine instance 722 to delete the ML training container 730 and/or to delete any model data stored in the training model data store 775.

As described below, in some embodiments, the model data stored in the training model data store 775 is used by the model hosting system 140 to deploy machine learning models. Alternatively or additionally, a user device 702 or another computing device (not shown) can retrieve the model data from the training model data store 775 to implement a learning algorithm in an external device. As an illustrative example, a robotic device can include sensors to capture input data. A user device 702 can retrieve the model data from the training model data store 775 and store the model data in the robotic device. The model data defines a machine learning model. Thus, the robotic device can provide the captured input data as an input to the machine learning model, resulting in an output. The robotic device can then perform an action (e.g., move forward, raise an arm, generate a sound, etc.) based on the resulting output.

While the virtual machine instances 722 are shown in FIG. 7 as a single grouping of virtual machine instances 722, some embodiments of the present application separate virtual machine instances 722 that are actively assigned to execute tasks from those virtual machine instances 722 that are not actively assigned to execute tasks. For example, those virtual machine instances 722 actively assigned to execute tasks are grouped into an "active pool," while those virtual machine instances 722 not actively assigned to execute tasks are placed within a "warming pool." In some embodiments, those virtual machine instances 722 within the warming pool can be pre-initialized with an operating system, language runtimes, and/or other software required to enable rapid execution of tasks (e.g., rapid initialization of machine learning model training in ML training container(s) 730) in response to training requests.

In some embodiments, the model training system 120 includes a processing unit, a network interface, a computer-readable medium drive, and an input/output device interface, all of which can communicate with one another by way of a communication bus. The network interface can provide connectivity to one or more networks or computing systems. The processing unit can thus receive information and instructions from other computing systems or services (e.g., user devices 702, the model hosting system 140, etc.). The processing unit can also communicate to and from a memory of a virtual machine instance 722 and further provide output information for an optional display via the input/output device interface. The input/output device interface can also accept input from an optional input device. The memory can contain computer program instructions (grouped as modules in some embodiments) that the processing unit executes in order to implement one or more aspects of the present disclosure.

In some embodiments, the model hosting system 140 includes a single physical computing device or multiple physical computing devices that are interconnected using one or more computing networks (not shown), where the physical computing device(s) host one or more virtual machine instances 742. The model hosting system 140 can handle the acquisition and configuration of compute capacity (e.g., containers, instances, etc.) based on demand for the execution of trained machine learning models. The model hosting system 140 can then execute machine learning models using the compute capacity, as is described in greater detail below. The model hosting system 140 can automatically scale up and down based on the volume of execution requests received from user devices 702 via frontend 749 of the model hosting system 140, thereby relieving the user from the burden of having to worry about over-utilization (e.g., acquiring too little computing resources and suffering performance issues) or under-utilization (e.g., acquiring more computing resources than necessary to run the machine learning models, and thus overpaying).

In some embodiments, the virtual machine instances 742 are utilized to execute tasks. For example, such tasks can include executing a machine learning model. As shown in FIG. 7, each virtual machine instance 742 includes an operating system (OS) 744, a language runtime 746, and one or more ML scoring containers 750. The ML scoring containers 750 are similar to the ML training containers 730 in that the ML scoring containers 750 are logical units created within a virtual machine instance using the resources available on that instance and can be utilized to isolate execution of a task from other processes (e.g., task executions) occurring in the instance. In some embodiments, the ML scoring containers 750 are formed from one or more container images and a top container layer. Each container image further includes one or more image layers, where each image layer represents an executable instruction. As described above, some or all of the executable instructions together represent an algorithm that defines a machine learning model. Changes made to the ML scoring containers 750 (e.g., creation of new files, modification of existing files, deletion of files, etc.) are stored in the top container layer. If a ML scoring container 750 is deleted, the top container layer is also deleted. However, the container image(s) that form a portion of the deleted ML scoring container 750 can remain unchanged. The ML scoring containers 750 can be implemented, for example, as Linux containers.

The ML scoring containers 750 each include a runtime 754, code 756, and dependencies 752 (e.g., supporting software such as libraries) needed by the code 756 in some embodiments. The runtime 754 can be defined by one or more executable instructions that form at least a portion of a container image that is used to form the ML scoring container 750 (e.g., the executable instruction(s) in the container image that define the operating system and/or runtime to run in the container formed from the container image). The code 756 includes one or more executable instructions that form at least a portion of a container image that is used to form the ML scoring container 750. For example, the code 756 includes the executable instructions in the container image that represent an algorithm that defines a machine learning model, which may reference dependencies 752. The code 756 can also include model data that represent characteristics of the defined machine learning model, as described in greater detail below. The runtime 754 is configured to execute the code 756 in response to an instruction to begin execution of a machine learning model. Execution of the code 756 results in the generation of outputs (e.g., predicted or "inferred" results), as described in greater detail below.

In some embodiments, the runtime 754 is the same as the runtime 746 utilized by the virtual machine instance 742. In some embodiments, runtime 754 is different than the runtime 746 utilized by the virtual machine instance 742.

In some embodiments, the model hosting system 140 uses one or more container images included in a deployment request (or a container image retrieved from the container data store 770 in response to a received deployment request) to create and initialize a ML scoring container 750 in a virtual machine instance 742. For example, the model hosting system 140 creates a ML scoring container 750 that includes the container image(s) and/or a top container layer.

As described above, a user device 702 can submit a deployment request and/or an execution request to the model hosting system 140 via the frontend 749 in some embodiments. A deployment request causes the model hosting system 140 to deploy a trained machine learning model into a virtual machine instance 742. For example, the deployment request can include an identification of an endpoint (e.g., an endpoint name, such as an HTTP endpoint name) and an identification of one or more trained machine learning models (e.g., a location of one or more model data files stored in the training model data store 775). Optionally, the deployment request also includes an identification of one or more container images stored in the container data store 770.

Upon receiving the deployment request, the model hosting system 140 initializes ones or more ML scoring containers 750 in one or more hosted virtual machine instance 742. In embodiments in which the deployment request includes an identification of one or more container images, the model hosting system 140 forms the ML scoring container(s) 750 from the identified container image(s). For example, a container image identified in a deployment request can be the same container image used to form an ML training container 730 used to train the machine learning model corresponding to the deployment request. Thus, the code 756 of the ML scoring container(s) 750 includes one or more executable instructions in the container image(s) that represent an algorithm that defines a machine learning model. In embodiments in which the deployment request does not include an identification of a container image, the model hosting system 140 forms the ML scoring container(s) 750 from one or more container images stored in the container data store 770 that are appropriate for executing the identified trained machine learning model(s). For example, an appropriate container image can be a container image that includes executable instructions that represent an algorithm that defines the identified trained machine learning model(s).

The model hosting system 140 further forms the ML scoring container(s) 750 by retrieving model data corresponding to the identified trained machine learning model(s) in some embodiments. For example, the deployment request can identify a location of model data file(s) stored in the training model data store 775. In embodiments in which a single model data file is identified in the deployment request, the model hosting system 140 retrieves the identified model data file from the training model data store 775 and inserts the model data file into a single ML scoring container 750, which forms a portion of code 756. In some embodiments, the model data file is archived or compressed (e.g., formed from a package of individual files). Thus, the model hosting system 140 unarchives or decompresses the model data file to obtain multiple individual files and inserts the individual files into the ML scoring container 750. In some embodiments, the model hosting system 140 stores the model data file in the same location as the location in which the model data file was stored in the ML training container 730 that generated the model data file. For example, the model data file initially was stored in the top container layer of the ML training container 730 at a certain offset, and the model hosting system 140 then stores the model data file in the top container layer of the ML scoring container 750 at the same offset.

In embodiments in which multiple model data files are identified in the deployment request, the model hosting system 140 retrieves the identified model data files from the training model data store 775. The model hosting system 140 can insert the model data files into the same ML scoring container 750, into different ML scoring containers 750 initialized in the same virtual machine instance 742, or into different ML scoring containers 750 initialized in different virtual machine instances 742. As an illustrative example, the deployment request can identify multiple model data files corresponding to different trained machine learning models because the trained machine learning models are related (e.g., the output of one trained machine learning model is used as an input to another trained machine learning model). Thus, the user may desire to deploy multiple machine learning models to eventually receive a single output that relies on the outputs of multiple machine learning models.

In some embodiments, the model hosting system 140 associates the initialized ML scoring container(s) 750 with the endpoint identified in the deployment request. For example, each of the initialized ML scoring container(s) 750 can be associated with a network address. The model hosting system 140 can map the network address(es) to the identified endpoint, and the model hosting system 140 or another system (e.g., a routing system, not shown) can store the mapping. Thus, a user device 702 can refer to trained machine learning model(s) stored in the ML scoring container(s) 750 using the endpoint. This allows for the network address of an ML scoring container 750 to change without causing the user operating the user device 702 to change the way in which the user refers to a trained machine learning model.

Once the ML scoring container(s) 750 are initialized, the ML scoring container(s) 750 are ready to execute trained machine learning model(s). In some embodiments, the user device 702 transmits an execution request to the model hosting system 140 via the frontend 749, where the execution request identifies an endpoint and includes an input to a machine learning model (e.g., a set of input data). The model hosting system 140 or another system (e.g., a routing system, not shown) can obtain the execution request, identify the ML scoring container(s) 750 corresponding to the identified endpoint, and route the input to the identified ML scoring container(s) 750.

In some embodiments, a virtual machine instance 742 executes the code 756 stored in an identified ML scoring container 750 in response to the model hosting system 140 receiving the execution request. In particular, execution of the code 756 causes the executable instructions in the code 756 corresponding to the algorithm to read the model data file stored in the ML scoring container 750, use the input included in the execution request as an input parameter, and generate a corresponding output. As an illustrative example, the algorithm can include coefficients, weights, layers, cluster centroids, and/or the like. The executable instructions in the code 756 corresponding to the algorithm can read the model data file to determine values for the coefficients, weights, layers, cluster centroids, and/or the like. The executable instructions can include input parameters, and the input included in the execution request can be supplied by the virtual machine instance 742 as the input parameters. With the machine learning model characteristics and the input parameters provided, execution of the executable instructions by the virtual machine instance 742 can be completed, resulting in an output.

In some embodiments, the virtual machine instance 742 stores the output in the model prediction data store 780. Alternatively or in addition, the virtual machine instance 742 transmits the output to the user device 702 that submitted the execution result via the frontend 749.

In some embodiments, the execution request corresponds to a group of related trained machine learning models. Thus, the ML scoring container 750 can transmit the output to a second ML scoring container 750 initialized in the same virtual machine instance 742 or in a different virtual machine instance 742. The virtual machine instance 742 that initialized the second ML scoring container 750 can then execute second code 756 stored in the second ML scoring container 750, providing the received output as an input parameter to the executable instructions in the second code 756. The second ML scoring container 750 further includes a model data file stored therein, which is read by the executable instructions in the second code 756 to determine values for the characteristics defining the machine learning model. Execution of the second code 756 results in a second output. The virtual machine instance 742 that initialized the second ML scoring container 750 can then transmit the second output to the model prediction data store 780 and/or the user device 702 via the frontend 749 (e.g., if no more trained machine learning models are needed to generate an output) or transmit the second output to a third ML scoring container 750 initialized in the same or different virtual machine instance 742 (e.g., if outputs from one or more additional trained machine learning models are needed), and the above-referenced process can be repeated with respect to the third ML scoring container 750.

While the virtual machine instances 742 are shown in FIG. 7 as a single grouping of virtual machine instances 742, some embodiments of the present application separate virtual machine instances 742 that are actively assigned to execute tasks from those virtual machine instances 742 that are not actively assigned to execute tasks. For example, those virtual machine instances 742 actively assigned to execute tasks are grouped into an "active pool," while those virtual machine instances 742 not actively assigned to execute tasks are placed within a "warming pool." In some embodiments, those virtual machine instances 742 within the warming pool can be pre-initialized with an operating system, language runtimes, and/or other software required to enable rapid execution of tasks (e.g., rapid initialization of ML scoring container(s) 750, rapid execution of code 756 in ML scoring container(s), etc.) in response to deployment and/or execution requests.

In some embodiments, the model hosting system 140 includes a processing unit, a network interface, a computer-readable medium drive, and an input/output device interface, all of which can communicate with one another by way of a communication bus. The network interface can provide connectivity to one or more networks or computing systems. The processing unit can thus receive information and instructions from other computing systems or services (e.g., user devices 702, the model training system 120, etc.). The processing unit can also communicate to and from a memory of a virtual machine instance 742 and further provide output information for an optional display via the input/output device interface. The input/output device interface can also accept input from an optional input device. The memory can contain computer program instructions (grouped as modules in some embodiments) that the processing unit executes in order to implement one or more aspects of the present disclosure.

In some embodiments, the operating environment supports many different types of machine learning models, such as multi-arm bandit models, reinforcement learning models, ensemble machine learning models, deep learning models, or the like.

The model training system 120 and the model hosting system 140 depicted in FIG. 7 are not meant to be limiting. For example, the model training system 120 and/or the model hosting system 140 could also operate within a computing environment having a fewer or greater number of devices than are illustrated in FIG. 7. Thus, the depiction of the model training system 120 and/or the model hosting system 140 in FIG. 7 may be taken as illustrative and not limiting to the present disclosure. For example, the model training system 120 and/or the model hosting system 140 or various constituents thereof could implement various Web services components, hosted or "cloud" computing environments, and/or peer-to-peer network configurations to implement at least a portion of the processes described herein. In some embodiments, the model training system 120 and/or the model hosting system 140 are implemented directly in hardware or software executed by hardware devices and may, for instance, include one or more physical or virtual servers implemented on physical computer hardware configured to execute computer-executable instructions for performing the various features that are described herein. The one or more servers can be geographically dispersed or geographically co-located, for instance, in one or more points of presence (POPs) or regional data centers.

The frontend 729 processes all training requests received from user devices 702 and provisions virtual machine instances 722. In some embodiments, the frontend 729 serves as a front door to all the other services provided by the model training system 120. The frontend 729 processes the requests and makes sure that the requests are properly authorized. For example, the frontend 729 may determine whether the user associated with the training request is authorized to initiate the training process.

Similarly, frontend 749 processes all deployment and execution requests received from user devices 702 and provisions virtual machine instances 742. In some embodiments, the frontend 749 serves as a front door to all the other services provided by the model hosting system 140. The frontend 749 processes the requests and makes sure that the requests are properly authorized. For example, the frontend 749 may determine whether the user associated with a deployment request or an execution request is authorized to access the indicated model data and/or to execute the indicated machine learning model.

The training data store 760 stores training data and/or evaluation data. The training data can be data used to train machine learning models and evaluation data can be data used to evaluate the performance of machine learning models. In some embodiments, the training data and the evaluation data have common data. In some embodiments, the training data and the evaluation data do not have common data. In some embodiments, the training data includes input data and expected outputs. While the training data store 760 is depicted as being located external to the model training system 120 and the model hosting system 140, this is not meant to be limiting. For example, in some embodiments not shown, the training data store 760 is located internal to at least one of the model training system 120 or the model hosting system 140.

In some embodiments, the training metrics data store 765 stores model metrics. While the training metrics data store 765 is depicted as being located external to the model training system 120 and the model hosting system 140, this is not meant to be limiting. For example, in some embodiments not shown, the training metrics data store 765 is located internal to at least one of the model training system 120 or the model hosting system 140.

The container data store 770 stores container images, such as container images used to form ML training containers 730 and/or ML scoring containers 750, that can be retrieved by various virtual machine instances 722 and/or 742. While the container data store 770 is depicted as being located external to the model training system 120 and the model hosting system 140, this is not meant to be limiting. For example, in some embodiments not shown, the container data store 770 is located internal to at least one of the model training system 120 and the model hosting system 140.

The training model data store 775 stores model data files. In some embodiments, some of the model data files are comprised of a single file, while other model data files are packages of multiple individual files. While the training model data store 775 is depicted as being located external to the model training system 120 and the model hosting system 140, this is not meant to be limiting. For example, in some embodiments not shown, the training model data store 775 is located internal to at least one of the model training system 120 or the model hosting system 140.

The model prediction data store 780 stores outputs (e.g., execution results) generated by the ML scoring containers 750 in some embodiments. While the model prediction data store 780 is depicted as being located external to the model training system 120 and the model hosting system 140, this is not meant to be limiting. For example, in some embodiments not shown, the model prediction data store 780 is located internal to at least one of the model training system 120 and the model hosting system 140.

While the model training system 120, the model hosting system 140, the training data store 760, the training metrics data store 765, the container data store 770, the training model data store 775, and the model prediction data store 780 are illustrated as separate components, this is not meant to be limiting. In some embodiments, any one or all of these components can be combined to perform the functionality described herein. For example, any one or all of these components can be implemented by a single computing device, or by multiple distinct computing devices, such as computer servers, logically or physically grouped together to collectively operate as a server system. Any one or all of these components can communicate via a shared internal network, and the collective system (e.g., also referred to herein as a machine learning service) can communicate with one or more of the user devices 702 via the one or more network(s) 106.

Various example user devices 702 are shown in FIG. 7, including a desktop computer, laptop, and a mobile phone, each provided by way of illustration. In general, the user devices 702 can be any computing device such as a desktop, laptop or tablet computer, personal computer, wearable computer, server, personal digital assistant (PDA), hybrid PDA/mobile phone, mobile phone, electronic book reader, set-top box, voice command device, camera, digital media player, and the like. In some embodiments, the model training system 120 and/or the model hosting system 140 provides the user devices 702 with one or more user interfaces, command-line interfaces (CLI), application programing interfaces (API), and/or other programmatic interfaces for submitting training requests, deployment requests, and/or execution requests. In some embodiments, the user devices 702 can execute a stand-alone application that interacts with the model training system 120 and/or the model hosting system 140 for submitting training requests, deployment requests, and/or execution requests.

In some embodiments, the network 106 includes any wired network, wireless network, or combination thereof. For example, the network 106 may be a personal area network, local area network, wide area network, over-the-air broadcast network (e.g., for radio or television), cable network, satellite network, cellular telephone network, or combination thereof. As a further example, the network 106 may be a publicly accessible network of linked networks, possibly operated by various distinct parties, such as the Internet. In some embodiments, the network 106 may be a private or semi-private network, such as a corporate or university intranet. The network 106 may include one or more wireless networks, such as a Global System for Mobile Communications (GSM) network, a Code Division Multiple Access (CDMA) network, a Long Term Evolution (LTE) network, or any other type of wireless network. The network 106 can use protocols and components for communicating via the Internet or any of the other aforementioned types of networks. For example, the protocols used by the network 106 may include HTTP, HTTP Secure (HTTPS), Message Queue Telemetry Transport (MQTT), Constrained Application Protocol (CoAP), and the like. Protocols and components for communicating via the Internet or any of the other aforementioned types of communication networks are well known to those skilled in the art and, thus, are not described in more detail herein.

Figure 8:
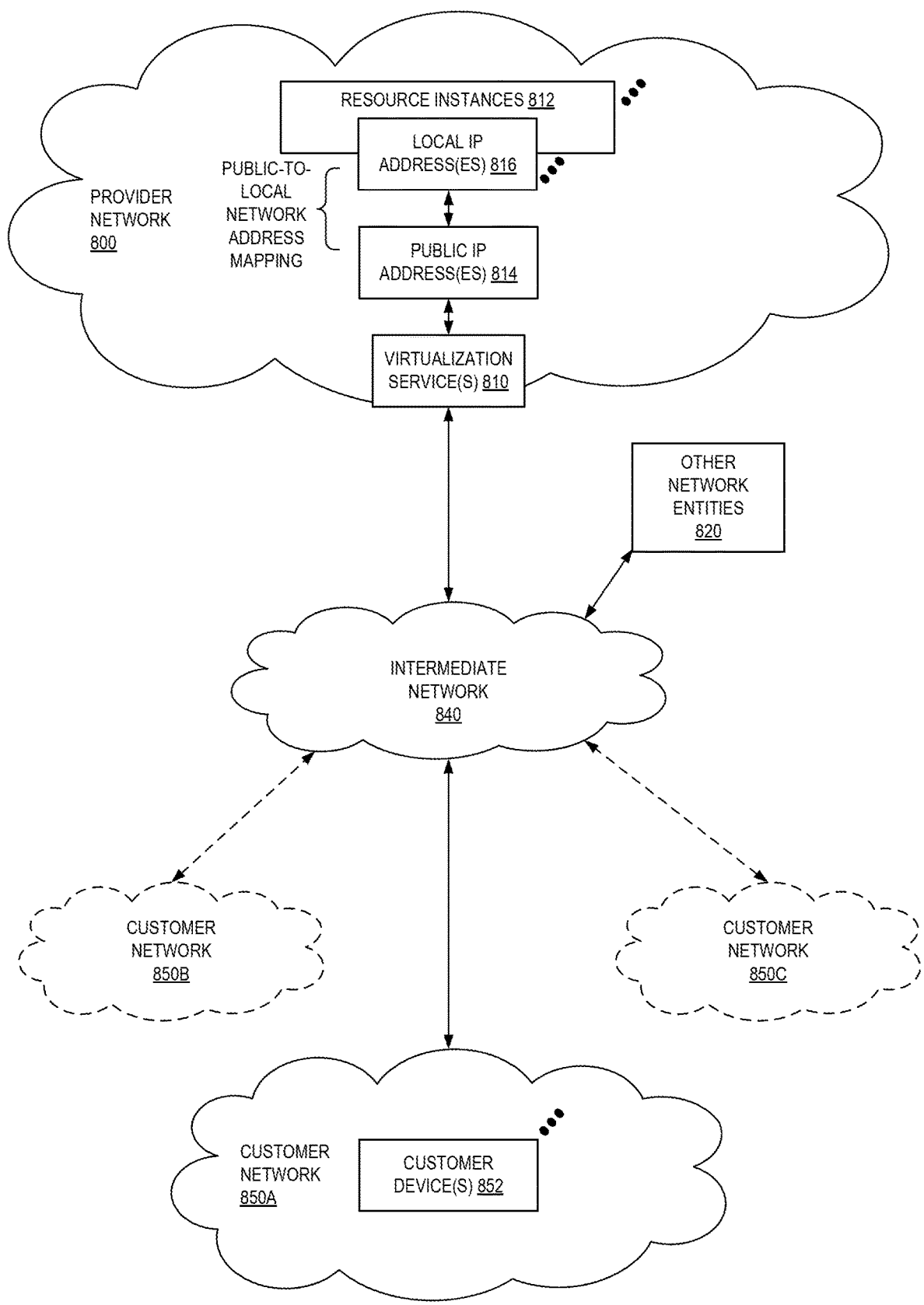
FIG. 8 illustrates an example provider network environment according to some embodiments.

FIG. 8 illustrates an example provider network (or "service provider system") environment according to some embodiments. A provider network 800 may provide resource virtualization to customers via one or more virtualization services 810 that allow customers to purchase, rent, or otherwise obtain instances 812 of virtualized resources, including but not limited to computation and storage resources, implemented on devices within the provider network or networks in one or more data centers. Local Internet Protocol (IP) addresses 816 may be associated with the resource instances 812; the local IP addresses are the internal network addresses of the resource instances 812 on the provider network 800. In some embodiments, the provider network 800 may also provide public IP addresses 814 and/or public IP address ranges (e.g., Internet Protocol version 4 (IPv4) or Internet Protocol version 6 (IPv6) addresses) that customers may obtain from the provider 800.

Conventionally, the provider network 800, via the virtualization services 810, may allow a customer of the service provider (e.g., a customer that operates one or more client networks 850A-850C including one or more customer device(s) 852) to dynamically associate at least some public IP addresses 814 assigned or allocated to the customer with particular resource instances 812 assigned to the customer. The provider network 800 may also allow the customer to remap a public IP address 814, previously mapped to one virtualized computing resource instance 812 allocated to the customer, to another virtualized computing resource instance 812 that is also allocated to the customer. Using the virtualized computing resource instances 812 and public IP addresses 814 provided by the service provider, a customer of the service provider such as the operator of customer network(s) 850A-850C may, for example, implement customer-specific applications and present the customer's applications on an intermediate network 840, such as the Internet. Other network entities 820 on the intermediate network 840 may then generate traffic to a destination public IP address 814 published by the customer network(s) 850A-850C; the traffic is routed to the service provider data center, and at the data center is routed, via a network substrate, to the local IP address 816 of the virtualized computing resource instance 812 currently mapped to the destination public IP address 814. Similarly, response traffic from the virtualized computing resource instance 812 may be routed via the network substrate back onto the intermediate network 840 to the source entity 820.

Local IP addresses, as used herein, refer to the internal or "private" network addresses, for example, of resource instances in a provider network. Local IP addresses can be within address blocks reserved by Internet Engineering Task Force (IETF) Request for Comments (RFC) 1918 and/or of an address format specified by IETF RFC 4193, and may be mutable within the provider network. Network traffic originating outside the provider network is not directly routed to local IP addresses; instead, the traffic uses public IP addresses that are mapped to the local IP addresses of the resource instances. The provider network may include networking devices or appliances that provide network address translation (NAT) or similar functionality to perform the mapping from public IP addresses to local IP addresses and vice versa.

Public IP addresses are Internet mutable network addresses that are assigned to resource instances, either by the service provider or by the customer. Traffic routed to a public IP address is translated, for example via 1:1 NAT, and forwarded to the respective local IP address of a resource instance.

Some public IP addresses may be assigned by the provider network infrastructure to particular resource instances; these public IP addresses may be referred to as standard public IP addresses, or simply standard IP addresses. In some embodiments, the mapping of a standard IP address to a local IP address of a resource instance is the default launch configuration for all resource instance types.

At least some public IP addresses may be allocated to or obtained by customers of the provider network 800; a customer may then assign their allocated public IP addresses to particular resource instances allocated to the customer. These public IP addresses may be referred to as customer public IP addresses, or simply customer IP addresses. Instead of being assigned by the provider network 800 to resource instances as in the case of standard IP addresses, customer IP addresses may be assigned to resource instances by the customers, for example via an API provided by the service provider. Unlike standard IP addresses, customer IP addresses are allocated to customer accounts and can be remapped to other resource instances by the respective customers as necessary or desired. A customer IP address is associated with a customer's account, not a particular resource instance, and the customer controls that IP address until the customer chooses to release it. Unlike conventional static IP addresses, customer IP addresses allow the customer to mask resource instance or availability zone failures by remapping the customer's public IP addresses to any resource instance associated with the customer's account. The customer IP addresses, for example, enable a customer to engineer around problems with the customer's resource instances or software by remapping customer IP addresses to replacement resource instances.

FIG. 'N illustrates an example data center that implements an overlay network on a network substrate using IP tunneling technology, according to some embodiments. A provider data center 'N00may include a network substrate that includes networking nodes 'N12 such as routers, switches, network address translators (NATs), and so on, which may be implemented as software, hardware, or as a combination thereof. Some embodiments may employ an Internet Protocol (IP) tunneling technology to provide an overlay network via which encapsulated packets may be passed through network substrate 'N10using tunnels. The IP tunneling technology may provide a mapping and encapsulating system for creating an overlay network on a network (e.g., a local network in data center 'N00 of FIG. 'N) and may provide a separate namespace for the overlay layer (the public IP addresses) and the network substrate 'N10 layer (the local IP addresses). Packets in the overlay layer may be checked against a mapping directory (e.g., provided by mapping service 'N30) to determine what their tunnel substrate target (local IP address) should be. The IP tunneling technology provides a virtual network topology (the overlay network); the interfaces (e.g., service APIs) that are presented to customers are attached to the overlay network so that when a customer provides an IP address to which the customer wants to send packets, the IP address is run in virtual space by communicating with a mapping service (e.g., mapping service 'N30) that knows where the IP overlay addresses are.

In some embodiments, the IP tunneling technology may map IP overlay addresses (public IP addresses) to substrate IP addresses (local IP addresses), encapsulate the packets in a tunnel between the two namespaces, and deliver the packet to the correct endpoint via the tunnel, where the encapsulation is stripped from the packet. In FIG. 'N, an example overlay network tunnel 'N34A from a virtual machine (VM) 'N24A (of VMs 'N24A1-'N24A4, via VMM 'N22A) on host 'N20A to a device on the intermediate network 'N50 and an example overlay network tunnel 'N34B between a VM 'N24A (of VMs 'N24A1-'N24A4, via VMM 'N22A) on host 'N20A and a VM 'N24B (of VMs 'N24B1-'N24B4, via VMM 'N22B) on host 'N20B are shown. In some embodiments, a packet may be encapsulated in an overlay network packet format before sending, and the overlay network packet may be stripped after receiving. In other embodiments, instead of encapsulating packets in overlay network packets, an overlay network address (public IP address) may be embedded in a substrate address (local IP address) of a packet before sending, and stripped from the packet address upon receiving. As an example, the overlay network may be implemented using 32-bit IPv4 (Internet Protocol version 4) addresses as the public IP addresses, and the IPv4 addresses may be embedded as part of 128-bit IPv6 (Internet Protocol version 6) addresses used on the substrate network as the local IP addresses.

Referring to FIG. 'N, at least some networks in which embodiments may be implemented may include hardware virtualization technology that enables multiple operating systems to run concurrently on a host computer (e.g., hosts 'N20A and 'N20B of FIG. 'N), i.e. as virtual machines (VMs) 'N24 on the hosts 'N20. The VMs 'N24 may, for example, be executed in slots on the hosts 'N20 that are rented or leased to customers of a network provider. A hypervisor, or virtual machine monitor (VMM) 'N22, on a host 'N20 presents the VMs 'N24 on the host with a virtual platform and monitors the execution of the VMs 'N24. Each VM 'N24 may be provided with one or more local IP addresses; the VMM 'N22 on a host 'N20 may be aware of the local IP addresses of the VMs 'N24 on the host. A mapping service 'N30 may be aware of (e.g., via stored mapping information 'N32) network IP prefixes and IP addresses of routers or other devices serving IP addresses on the local network. This includes the IP addresses of the VMMs 'N22 serving multiple VMs 'N24. The mapping service 'N30 may be centralized, for example on a server system, or alternatively may be distributed among two or more server systems or other devices on the network. A network may, for example, use the mapping service technology and IP tunneling technology to, for example, route data packets between VMs 'N24 on different hosts 'N20 within the data center '00 network; note that an interior gateway protocol (IGP) may be used to exchange routing information within such a local network.

In addition, a network such as the provider data center 'N00 network (which is sometimes referred to as an autonomous system (AS)) may use the mapping service technology, IP tunneling technology, and routing service technology to route packets from the VMs 'N24 to Internet destinations, and from Internet sources to the VMs 'N24. Note that an external gateway protocol (EGP) or border gateway protocol (BGP) is typically used for Internet routing between sources and destinations on the Internet. FIG. 'N shows an example provider data center 'N00 implementing a network that provides resource virtualization technology and that provides full Internet access via edge router(s) 'N14 that connect to Internet transit providers, according to some embodiments. The provider data center 'N00 may, for example, provide customers the ability to implement virtual computing systems (VMs 'N24) via a hardware virtualization service and the ability to implement virtualized data stores 'N16 on storage resources 'N18A-'N18N via a storage service.

The data center 'N00 network may implement IP tunneling technology, mapping service technology, and a routing service technology to route traffic to and from virtualized resources, for example to route packets from the VMs 'N24 on hosts 'N20 in data center 'N00 to Internet destinations, and from Internet sources to the VMs 'N24. Internet sources and destinations may, for example, include computing systems 'N70 connected to the intermediate network 'N40 and computing systems 'N52 connected to local networks 'N50 that connect to the intermediate network 'N40 (e.g., via edge router(s) 'N14 that connect the network 'N50 to Internet transit providers). The provider data center 'N00 network may also route packets between resources in data center 'N00, for example from a VM 'N24 on a host 'N20 in data center 'N00 to other VMs 'N24 on the same host or on other hosts 'N20 in data center 'N00.

A service provider that provides data center 'N00 may also provide additional data center(s) 'N60 that include hardware virtualization technology similar to data center 'N00 and that may also be connected to intermediate network 'N40. Packets may be forwarded from data center 'N00 to other data centers 'N60, for example from a VM 'N24 on a host 'N20 in data center 'N00 to another VM on another host in another, similar data center 'N60, and vice versa.

While the above describes hardware virtualization technology that enables multiple operating systems to run concurrently on host computers as virtual machines (VMs) on the hosts, where the VMs may be instantiated on slots on hosts that are rented or leased to customers of the network provider, the hardware virtualization technology may also be used to provide other computing resources, for example storage resources 'N18A-'N18N, as virtualized resources to customers of a network provider in a similar manner.

Figure 9:
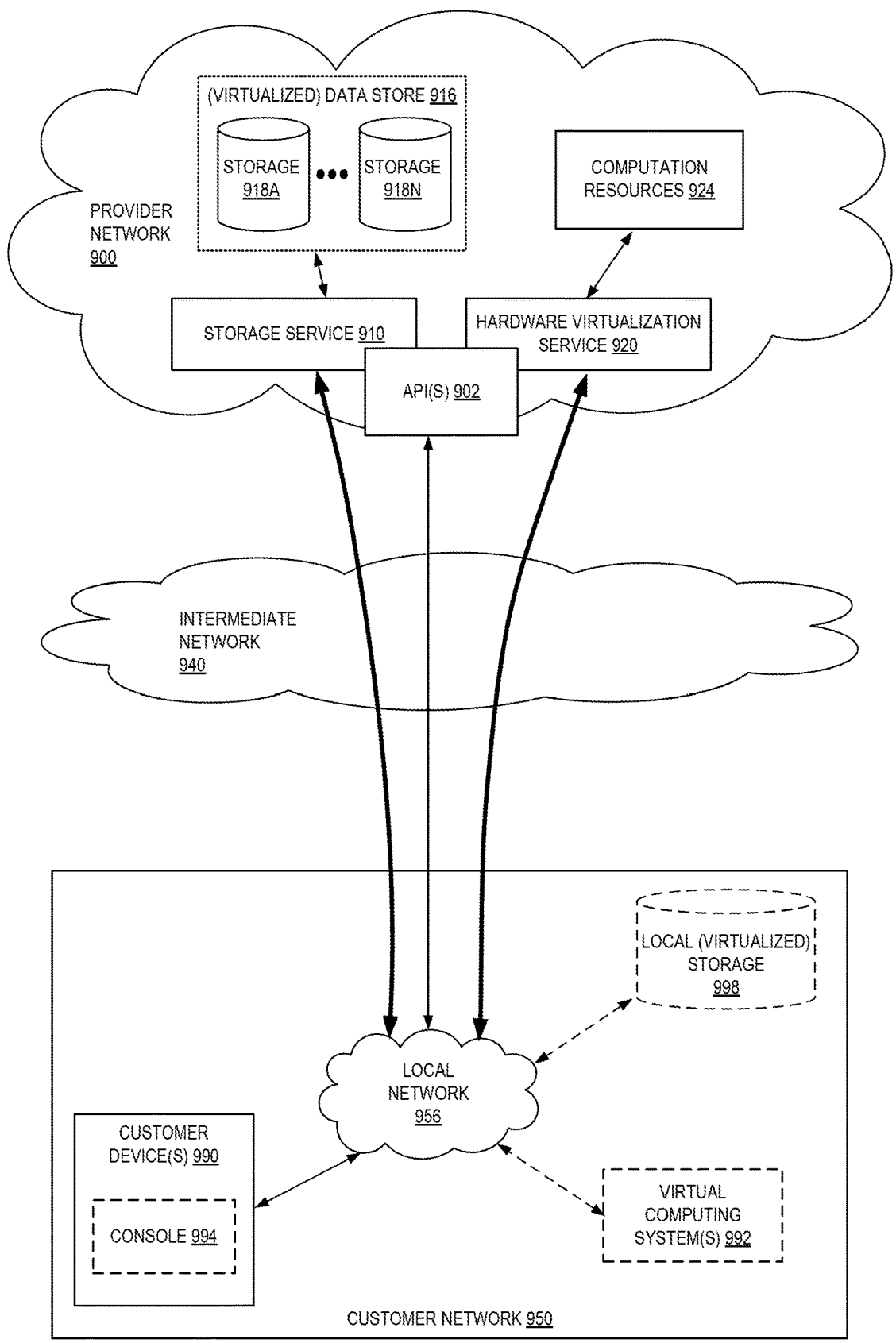
FIG. 9 is a block diagram of an example provider network that provides a storage service and a hardware virtualization service to customers according to some embodiments.

FIG. 9 is a block diagram of an example provider network that provides a storage service and a hardware virtualization service to customers, according to some embodiments. Hardware virtualization service 920 provides multiple computation resources 924 (e.g., VMs) to customers. The computation resources 924 may, for example, be rented or leased to customers of the provider network 900 (e.g., to a customer that implements customer network 950). Each computation resource 924 may be provided with one or more local IP addresses. Provider network 900 may be configured to route packets from the local IP addresses of the computation resources 924 to public Internet destinations, and from public Internet sources to the local IP addresses of computation resources 924.

Provider network 900 may provide a customer network 950, for example coupled to intermediate network 940 via local network 956, the ability to implement virtual computing systems 992 via hardware virtualization service 920 coupled to intermediate network 940 and to provider network 900. In some embodiments, hardware virtualization service 920 may provide one or more APIs 902, for example a web services interface, via which a customer network 950 may access functionality provided by the hardware virtualization service 920, for example via a console 994 (e.g., a web-based application, standalone application, mobile application, etc.). In some embodiments, at the provider network 900, each virtual computing system 992 at customer network 950 may correspond to a computation resource 924 that is leased, rented, or otherwise provided to customer network 950.

From an instance of a virtual computing system 992 and/or another customer device 990 (e.g., via console 994), the customer may access the functionality of storage service 910, for example via one or more APIs 902, to access data from and store data to storage resources 918A-918N of a virtual data store 916 (e.g., a folder or "bucket", a virtualized volume, a database, etc.) provided by the provider network 900. In some embodiments, a virtualized data store gateway (not shown) may be provided at the customer network 950 that may locally cache at least some data, for example frequently-accessed or critical data, and that may communicate with storage service 910 via one or more communications channels to upload new or modified data from a local cache so that the primary store of data (virtualized data store 916) is maintained. In some embodiments, a user, via a virtual computing system 992 and/or on another customer device 990, may mount and access virtual data store 916 volumes via storage service 910 acting as a storage virtualization service, and these volumes may appear to the user as local (virtualized) storage 998.

While not shown in FIG. 9, the virtualization service(s) may also be accessed from resource instances within the provider network 900 via API(s) 902. For example, a customer, appliance service provider, or other entity may access a virtualization service from within a respective virtual network on the provider network 900 via an API 902 to request allocation of one or more resource instances within the virtual network or within another virtual network.

Illustrative System

Figure 10:
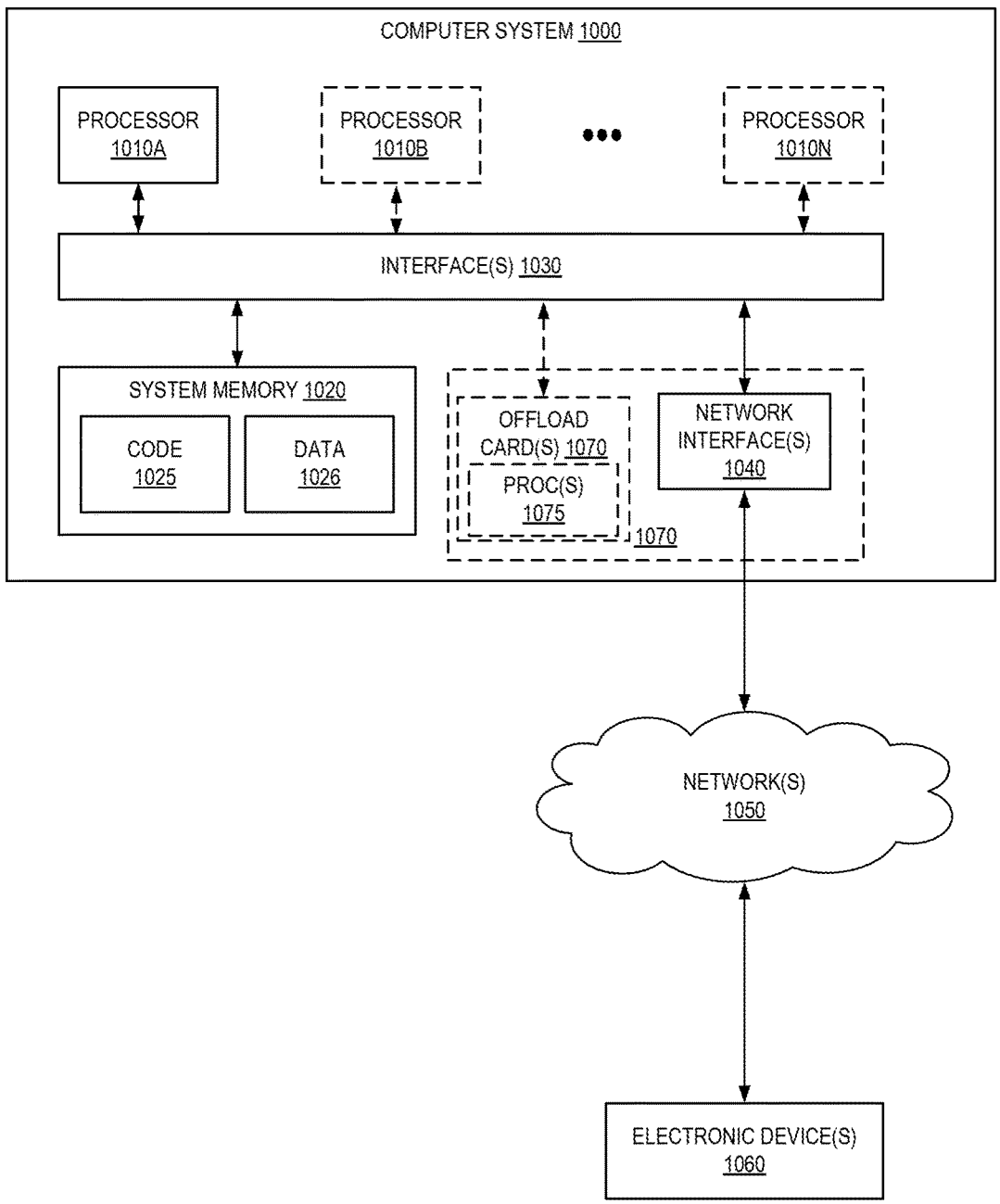
FIG. 10 is a block diagram illustrating an example computer system that may be used in some embodiments.

In some embodiments, a system that implements a portion or all of the techniques described herein may include a general-purpose computer system that includes or is configured to access one or more computer-accessible media, such as computer system 1000 illustrated in FIG. 10. In the illustrated embodiment, computer system 1000 includes one or more processors 1010 coupled to a system memory 1020 via an input/output (I/O) interface 1030. Computer system 1000 further includes a network interface 1040 coupled to I/O interface 1030. While FIG. 10 shows computer system 1000 as a single computing device, in various embodiments a computer system 1000 may include one computing device or any number of computing devices configured to work together as a single computer system 1000.

In various embodiments, computer system 1000 may be a uniprocessor system including one processor 1010, or a multiprocessor system including several processors 1010 (e.g., two, four, eight, or another suitable number). Processors 1010 may be any suitable processors capable of executing instructions. For example, in various embodiments, processors 1010 may be general-purpose or embedded processors implementing any of a variety of instruction set architectures (ISAs), such as the x86, ARM, PowerPC, SPARC, or MIPS ISAs, or any other suitable ISA. In multiprocessor systems, each of processors 1010 may commonly, but not necessarily, implement the same ISA.

System memory 1020 may store instructions and data accessible by processor(s) 1010. In various embodiments, system memory 1020 may be implemented using any suitable memory technology, such as random-access memory (RAM), static RAM (SRAM), synchronous dynamic RAM (SDRAM), nonvolatile/Flash-type memory, or any other type of memory. In the illustrated embodiment, program instructions and data implementing one or more desired functions, such as those methods, techniques, and data described above are shown stored within system memory 1020 as code 1025 and data 1026.

In one embodiment, I/O interface 1030 may be configured to coordinate I/O traffic between processor 1010, system memory 1020, and any peripheral devices in the device, including network interface 1040 or other peripheral interfaces. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. Also, in some embodiments some or all of the functionality of I/O interface 1030, such as an interface to system memory 1020, may be incorporated directly into processor 1010.

Network interface 1040 may be configured to allow data to be exchanged between computer system 1000 and other devices 1060 attached to a network or networks 1050, such as other computer systems or devices as illustrated in FIG. 1, for example. In various embodiments, network interface 1040 may support communication via any suitable wired or wireless general data networks, such as types of Ethernet network, for example. Additionally, network interface 1040 may support communication via telecommunications/telephony networks such as analog voice networks or digital fiber communications networks, via storage area networks (SANs) such as Fibre Channel SANs, or via I/O any other suitable type of network and/or protocol.

In some embodiments, a computer system 1000 includes one or more offload cards 1070 (including one or more processors 1075, and possibly including the one or more network interfaces 1040) that are connected using an I/O interface 1030 (e.g., a bus implementing a version of the Peripheral Component Interconnect-Express (PCI-E) standard, or another interconnect such as a QuickPath interconnect (QPI) or UltraPath interconnect (UPI)). For example, in some embodiments the computer system 1000 may act as a host electronic device (e.g., operating as part of a hardware virtualization service) that hosts compute instances, and the one or more offload cards 1070 execute a virtualization manager that can manage compute instances that execute on the host electronic device. As an example, in some embodiments the offload card(s) 1070 can perform compute instance management operations such as pausing and/or un-pausing compute instances, launching and/or terminating compute instances, performing memory transfer/copying operations, etc. These management operations may, in some embodiments, be performed by the offload card(s) 1070 in coordination with a hypervisor (e.g., upon a request from a hypervisor) that is executed by the other processors 1010A-1010N of the computer system 1000. However, in some embodiments the virtualization manager implemented by the offload card(s) 1070 can accommodate requests from other entities (e.g., from compute instances themselves), and may not coordinate with (or service) any separate hypervisor.

In some embodiments, system memory 1020 may be one embodiment of a computer-accessible medium configured to store program instructions and data as described above. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 1000 via I/O interface 1030. A non-transitory computer-accessible storage medium may also include any volatile or non-volatile media such as RAM (e.g., SDRAM, double data rate (DDR) SDRAM, SRAM, etc.), read only memory (ROM), etc., that may be included in some embodiments of computer system 1000 as system memory 1020 or another type of memory. Further, a computer-accessible medium may include transmission media or signals such as electrical, electromagnetic, or digital signals, conveyed via a communication medium such as a network and/or a wireless link, such as may be implemented via network interface 1040.

In the preceding description, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Bracketed text and blocks with dashed borders (e.g., large dashes, small dashes, dot-dash, and dots) are used herein to illustrate optional operations that add additional features to some embodiments. However, such notation should not be taken to mean that these are the only options or optional operations, and/or that blocks with solid borders are not optional in certain embodiments.

Reference numerals with suffix letters (e.g., 918A-918N) may be used to indicate that there can be one or multiple instances of the referenced entity in various embodiments, and when there are multiple instances, each does not need to be identical but may instead share some general traits or act in common ways. Further, the particular suffixes used are not meant to imply that a particular amount of the entity exists unless specifically indicated to the contrary. Thus, two entities using the same or different suffix letters may or may not have the same number of instances in various embodiments.

References to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Moreover, in the various embodiments described above, unless specifically noted otherwise, disjunctive language such as the phrase "at least one of A, B, or C" is intended to be understood to mean either A, B, or C, or any combination thereof (e.g., A, B, and/or C). As such, disjunctive language is not intended to, nor should it be understood to, imply that a given embodiment requires at least one of A, at least one of B, or at least one of C to each be present.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

What is claimed is:

1. A computer-implemented method comprising:
   receiving, from a computing device of a user, a command to train a machine learning (ML) model using a reinforcement learning algorithm and a user-specified reward function, wherein the command identifies a fleet of one or more compute instances implementing an application within a multi-tenant provider network, the one or more compute instances including at least one compute instance of a first type;
   wherein the user-specified reward function is based at least on all of: (a) minimizing a compute resource utilization of the fleet by the application, (b) minimizing a service credit or monetary unit cost charged to the user by a provider of the multi-tenant provider network for use of the fleet by the application, and (c) minimizing a number of auto-scaling changes to the fleet;
   training the ML model based at least in part on both a simulation of the application and the user-specified reward function;
   wherein the simulation comprises adding compute instances of a plurality of different compute instance types to the fleet and evaluating the user-specified reward function at a plurality of different states of the application;
   wherein each state of the plurality of different states of the application corresponds to an addition to the fleet of a compute instance of a different one of the plurality of different compute instance types;
   wherein each different compute instance type of the plurality of different compute instance types is associated with a different service credit or monetary unit cost charged to the user by the provider of the multi-tenant provider network for use of the fleet by the application;
   wherein each different compute instance type of the plurality of different compute instance types differs from each other compute instance type of the plurality of different compute instance types by at least a number of processors or an amount of memory;
   deploying the trained ML model behind an endpoint;
   obtaining operational metrics associated with the fleet;
   sending a request to the endpoint, the request including a state input based at least in part on the operational metrics;
   obtaining a response indicating that at least one compute instance of a second type, of the plurality of different compute instance types, is to be added to the fleet, wherein the second type includes a greater amount of resources in at least one dimension than the corresponding one or more dimensions of the first type; and
   adding the at least one compute instance of the second type to the fleet.

2. The computer-implemented method of claim 1, wherein the operational metrics associated with the fleet comprise processor utilization and memory utilization metrics associated with the fleet.

3. The computer-implemented method of claim 1, wherein the second type of compute instance comprises at least one different computing resource amount than the corresponding computing resource amount provided by the first type of compute instance, wherein the at least one different computing resource amount is:
   a number of virtual processors or processing cores;
   an amount of volatile memory;
   an amount of non-volatile memory;
   an amount of networking bandwidth; or
   any combination thereof.

4. A computer-implemented method comprising:
   obtaining operational metrics associated with a fleet of one or more compute instances implementing an application, the one or more compute instances including at least one compute instance of a first type;
   sending a request to an endpoint associated with a trained machine learning (ML) model, the request including a state input based at least in part on the operational metrics;
   wherein the trained ML model is trained based on all of: a reinforcement learning algorithm, a reward function, and a simulation of the application;
   wherein the simulation of the application comprises adding compute instances of a plurality of different compute instance types to the fleet and evaluating the reward function at a plurality of different states of the simulation;
   wherein each state of the plurality of different states of the simulation corresponds to an addition to the fleet of a compute instance of a different one of the plurality of different compute instance types;
obtaining a response indicating that at least one compute instance of a second type, of the plurality of different compute instance types, is to be added to the fleet; and
adding the at least one compute instance of the second type to the fleet.

5. The computer-implemented method of claim 4, further comprising:
receiving, from a computing device associated with a user, the reward function or an identifier of the reward function.

6. The computer-implemented method of claim 5, further comprising:
obtaining an application template that identifies a structure of the application; and
deploying, based at least in part on the application template, the application to a simulation environment.

7. The computer-implemented method of claim 6, further comprising:
obtaining one or more traffic logs associated with the application,
wherein training the ML model comprises sending test traffic to the application within the simulation environment, wherein the test traffic is generated based at least in part on an analysis of the one or more traffic logs.

8. The computer-implemented method of claim 5, wherein the reward function is based at least in part on:
a resource utilization associated with the one or more compute instances of the fleet;
a cost amount associated with the fleet; or
both the resource utilization and the cost amount.

9. The computer-implemented method of claim 5, further comprising:
deploying the ML model, comprising causing the endpoint to be configured to send inference requests received at the endpoint to a compute instance hosting the ML model.

10. The computer-implemented method of claim 4, wherein the application is a three-tier web application, and wherein the fleet of one or more compute instances implementing the application implement at least one or more web servers and one or more database servers.

11. The computer-implemented method of claim 10, wherein the at least one compute instance of the first type and the at least one compute instance of the second type belong to a same tier of the three-tier web application.

12. The computer-implemented method of claim 4, further comprising:
prior to said sending the request to the endpoint,
sending one or more other requests to the endpoint,
receiving one or more other responses indicating that one or more changes to a composition of the fleet are needed, and
determining to not act on the one or more other responses.

13. The computer-implemented method of claim 4, wherein the second type of compute instance comprises at least one different computing resource amount than the corresponding computing resource amount provided by the first type of compute instance, wherein the at least one different computing resource amount is:
a number of virtual processors or processing cores;
an amount of volatile memory;
an amount of non-volatile memory;
an amount of networking bandwidth; or
any combination thereof.

14. The computer-implemented method of claim 4, wherein:
obtaining the operational metrics, sending the request to the endpoint, obtaining the response, and adding the at least one compute instance of the second type to the fleet are performed by one or more serverless functions implemented by an on-demand code execution service of a multi-tenant provider network; and
the fleet of one or more compute instances implementing the application are implemented within the multi-tenant provider network.

15. A system comprising:
a machine learning (ML) service implemented by a first one or more electronic devices of a multi-tenant provider network, the ML service comprising instructions that upon execution cause the ML service to:
train a ML model based on all of: a reinforcement learning algorithm, a reward function, and a simulation of an application implemented by a fleet of one or more compute instances;
simulate the application by adding compute instances of a plurality of a different compute instance types to the fleet and evaluating the reward function at a plurality of different states of the simulation, wherein each state of the plurality of different states of the simulation corresponds to an addition to the fleet of a compute instance of a different one of the plurality of different compute instance types; and
host the trained ML model behind an endpoint; and
a scaling engine implemented by a second one or more electronic devices, the scaling engine comprising instructions that upon execution cause the scaling engine to:
obtain operational metrics associated with a fleet of one or more compute instances implementing an application, the one or more compute instances including at least one compute instance of a first type;
send a request to the endpoint associated with the trained ML model hosted by the ML service, the request including a state input based at least in part on the operational metrics;
receive a response indicating that at least one compute instance of a second type of the plurality of different compute instance types, is to be added to the fleet; and
add the at least one compute instance of the second type to the fleet.

16. The system of claim 15, wherein the instructions upon execution further cause the ML service to:
receive, from a computing device associated with a user, the reward function or an identifier of the reward function.

17. The system of claim 16, wherein the reward function is based at least in part on a resource utilization associated with the one or more compute instances of the fleet.

18. The system of claim 17, wherein the reward function is further based at least in part on a number of compute instances belonging to the fleet over an amount of time.

19. The system of claim 16, wherein the instructions upon execution further cause the scaling engine to:
deploy the trained ML model, comprising sending a request to the ML service to cause the endpoint to be configured to send inference requests received at the endpoint to a compute instance hosting the trained ML model.

20. The system of claim 16, wherein the instructions upon execution further cause the scaling engine to:

obtain an application template that identifies a structure of the application; and cause, based at least in part on the application template, the application to be deployed to a simulation environment.

\* \* \* \* \*